(12) United States Patent
Komatsuzaki

(10) Patent No.: US 6,873,536 B2
(45) Date of Patent: Mar. 29, 2005

(54) SHARED DATA BUFFER IN FERAM UTILIZING WORD LINE DIRECTION SEGMENTATION

(75) Inventor: Katsuo Komatsuzaki, Ibaraki (JP)

(73) Assignee: Texas Instruments Incorporated, Dallas, TX (US)

(*) Notice: Subject to any disclaimer, the term of this patent is extended or adjusted under 35 U.S.C. 154(b) by 76 days.

(21) Appl. No.: 10/126,394

(22) Filed: Apr. 19, 2002

(65) Prior Publication Data
US 2004/0047172 A1 Mar. 11, 2004

(51) Int. Cl.⁷ .................................................. G11C 11/22
(52) U.S. Cl. ...................... 365/145; 365/72; 365/230.3; 365/230.6
(58) Field of Search ........................ 365/145, 72, 230.3, 365/230.6

(56) References Cited
U.S. PATENT DOCUMENTS

| | | | |
|---|---|---|---|
| 6,046,926 A | * | 4/2000 | Tanaka et al. ............. 365/145 |
| 6,091,625 A | | 7/2000 | Braun et al. |
| 6,288,931 B1 | | 9/2001 | Kye et al. |
| 6,333,866 B1 | | 12/2001 | Ogata |
| 6,510,071 B2 | * | 1/2003 | Oowaki ...................... 365/145 |
| 6,636,448 B2 | * | 10/2003 | Koshikawa ................ 365/201 |
| 6,700,811 B1 | * | 3/2004 | Weng et al. ................ 365/145 |

* cited by examiner

Primary Examiner—Connie C. Yoha
(74) Attorney, Agent, or Firm—Jacqueline J. Garner; W. James Brady, III; Frederick J. Telecky, Jr.

(57) ABSTRACT

A ferro-electric memory device system and method is described for accessing and sensing memory cells of an FeRAM memory array with an open bit line architecture. The memory device permits the sharing of certain memory circuits such as, a data buffer, and a sense amplifier between several segments of an array of FeRAM memory cells associated with a plurality of plate lines and/or word lines of the array. Various combinations of segmented bit lines, segmented plate lines and/or segmented word lines facilitate sharing the memory circuits of the device between the array segments or multiple arrays of memory cells.

20 Claims, 20 Drawing Sheets

SHARED DATA BUFFER IN FERAM UTILIZING WORD LINE DIRECTION SEGMENTATION

TECHNICAL FIELD OF INVENTION

The present invention relates generally to the field of memory devices, and more specifically to a Ferro-electric memory device, which provides a means of sharing certain memory circuits and localized access of memory cells in combination with a simple sensing scheme for a sense amplifier used for sensing cells of an FeRAM array in open bit line architecture.

BACKGROUND OF THE INVENTION

Several trends exist presently in the semiconductor device fabrication industry and the electronics industry. Devices are continuously getting smaller and requiring less power. A reason for these trends is that more personal devices are being fabricated which are relatively small and portable, thereby relying on a small battery as its primary supply source. For example, cellular phones, personal computing devices, and personal sound systems are devices which are in great demand in the consumer market. In addition to being smaller and more portable, personal devices are requiring more computational power and on-chip memory. In light of all these trends, there is a need in the industry to provide a computational device, which has memory and logic functions, integrated onto the same semiconductor chip. Preferably, this memory will be configured such that if the battery dies, the contents of the memory will be retained. Such a memory device which retains its contents while power is not continuously applied thereto is called a non-volatile memory. Examples of conventional non-volatile memory include: electrically erasable, programmable read only memory ("EEPROM") and FLASH EEPROM.

A ferroelectric memory (FeRAM) is a non-volatile memory which utilizes a ferroelectric material, such as strontium bismuth tantalate (SBT) or lead zirconate titanate (PZT), as a capacitor dielectric situated between a bottom electrode and a top electrode. Both read and write operations are performed for an FeRAM. The memory size and memory architecture affects the read and write access times of an FeRAM. Table 1 illustrates exemplary differences between different memory types.

The non-volatility of an FeRAM is due to the bistable characteristic of the ferroelectric memory cell. An FeRAM cell may be selected by two concurrent X and Y voltage pulses, respectively, wherein X and Y correspond to a specific bit line and word line, respectively, identified by horizontal and vertical decoder circuitry. The FeRAM cells of the capacitor array which receive only one voltage pulse remain unselected while the cell that receives both an X and Y voltage signal flips to its opposite polarization state or remains unchanged, depending upon its initial polarization state, for example.

FIG. 1A is the characteristic curve plot 10 of a Ferroelectric capacitor. Plot 10 illustrates the charge "Q" (y-axis), and the voltage "V" (x-axis), including the characteristics placement relationship of a "0" state (15), and a "1" state (20) in a typical FeCap. The voltage "V" (x-axis) ranges from 0 volts (30) to $V_{CC}$ (40). The charge "Q" (y-axis) ranges as high as P+R+S (50). The "0" state requires a charge greater than or equal to $-(R+P+S)$, while the "1" state requires a charge greater than or equal to P+R+S to produce a state change of the FeCap.

Also in FIG. 1A, the quantity P is the "polarization charge", R is the "Remnant charge", and S is the "Saturation charge". These quantities identify most characteristics of the FeCap Characteristic curve segment 60 represents the charge path from a "0" state cell, thru $V_{CC}$ (40) as charge is applied to a FeCap, and then thru curve segment 70 to the stable "1" state as the voltage is relaxed to the FeCap. FIG. 1B is the schematic symbol 80 of the Ferroelectric capacitor of FIG. 1A, and the typical $½V_{CC}$ polling voltage which is applied to the plate line.

Several types of ferroelectric memory cells are used commonly, a single capacitor memory cell and a dual capacitor memory cell. Further, the single capacitor memory cell is generally broken down into two types; the 1C cell (one capacitor, or capacitor only) and the 1T1C cell (one transistor and one capacitor). The 1C cell has the obvious advantage of requiring one less access/isolation transistor and the accompanying silicon area, but may require more plate lines to limit the capacitance of the lines which couple all the cells wired in common. Because of this capacitance limitation, the 1C cell is seldom used. Both of the single capacitor memory cell types require less silicon area than the dual capacitor type (thereby increasing the potential density of the memory array), but are less immune to noise and process variations. Additionally, the 1C and 1T1C cell requires a voltage reference for determining a stored memory state.

TABLE 1

| Property | SRAM | Flash | DRAM | FeRAM (Demo) |
|---|---|---|---|---|
| Voltage | >0.5 V | Read >0.5 V Write (12 V) (±6 V) | >1 V | 3.3 V |
| Special Transistors | NO | YES (High Voltage) | YES (Low Leakage) | NO |
| Write Time | <10 ns | 100 ms | <30 ns | 60 ns |
| Write Endurance | >$10^{15}$ | <$10^5$ | >$10^{15}$ | >$10^{13}$ |
| Read Time (single/multi bit) | <10 ns | <30 ns | <30 ns/<2 ns | 60 ns |
| Read Endurance | >$10^{15}$ | >$10^{15}$ | >$10^{15}$ | >$10^{13}$ |
| Added Mask for embedded | 0 | ~6–8 | ~6–8 | ~3 |
| Cell Size (F~metal pitch/2) | ~80 $F^2$ | ~8 $F^2$ | ~8 $F^2$ | ~18 $F^2$ |
| Architecture | NDRO | NDRO | DRO | DRO |
| Non volatile | NO | YES | NO | YES |
| Storage | I | Q | Q | P |

The dual capacitor memory cell (referred to as a 2T2C memory cell) requires more silicon area, and it stores complementary signals allowing differential sampling of the stored information. The 2T2C memory cell is more stable than a 1T1C memory cell. As illustrated in prior art FIG. 2, a 1T1C FeRAM cell 100 includes one transistor 112 and one ferroelectric storage capacitor 114. A bottom electrode of the storage capacitor 114 is connected to a drain terminal 115 of the transistor 112. The 1T1C cell 100 is read from by applying a signal to the gate 116 of the transistor (word line WL)(e.g., the Y signal), thereby connecting the bottom electrode of the capacitor 114 to the source of the transistor (the bit line BL) 118. A pulse signal is then applied to the top electrode contact (the drive line or plate line PL) 120. The potential on the bitline 118 of the transistor 112 is, therefore, the capacitor charge divided by the bitline capacitance. Since the capacitor charge is dependent upon the bistable polarization state of the ferroelectric material, the bitline potential can have two distinct values. A sense amplifier (not shown) is connected to the bitline 118 and detects the voltage associated with a logic value of either 1 or 0 associated with the FeRAM polarization. Frequently the sense amplifier reference voltage is a ferroelectric or non-ferroelectric capacitor connected to another bitline that Is not being read. In this manner, the memory cell data is retrieved.

A characteristic of a ferroelectric memory is that a read operation is destructive in some applications. The data in a memory cell is then rewritten back to the memory cell after the read operation is completed. If the polarization of the ferroelectric is switched, the read operation is destructive and the sense amplifier must rewrite or restore (onto that cell) the correct polarization value as the bit just read from the cell. This is similar to the operation of a DRAM. If the drive line voltage was small enough not to switch the ferroelectric then the read operation was not destructive. In general, a non-destructive read requires a much larger capacitor than a destructive read and, therefore, requires a larger cell size.

As illustrated, for example, in prior art FIG. 3, a 2T2C memory cell 130 in a memory array couples to a bit line ("bitline") 132 and an inverse of the bit line ("bitline-bar") 134 that is common to many other memory types (for example, static random access memories). Memory cells of a memory block are formed in memory rows and memory columns. The 2T2C ferroelectric memory cell comprises two transistors 136 and 138 and two ferroelectric capacitors 140 and 142, respectively. The first transistor 136 couples between the bitline 132 and a first capacitor 140, and the second transistor 138 couples between the bitline-bar 134 and the second capacitor 142. The first and second capacitors 140 and 142 have a common terminal or plate (the plate line PL) 144 to which a signal is applied for polarizing the capacitors.

In a write operation, the first and second transistors 136 and 138 of the 2T2C ferroelectric memory cell 130 are enabled (e.g., via their respective word line 146) to couple the capacitors 140 and 142 to the complementary logic levels on the bitline 132 and the bitline-bar line 134 corresponding to a logic state to be stored in memory. The plate line common terminal 144 of the capacitors is pulsed during a write operation to polarize the 2T2C memory cell 130 to one of the two logic states.

In a read operation, the first and second transistors 136 and 138 of the 2T2C memory cell 130 are enabled via the word line 146 to couple the information stored on the first and second capacitors 140 and 142 to the bitline 132 and the bitline-bar line 134, respectively. A differential signal (not shown) is thus generated across the bitline 132 and the bitline-bar line 134 by the 2T2C memory cell 130. A sense amplifier (not shown) that provides a signal corresponding to the logic level stored in memory senses the differential signal.

FIG. 4 illustrates an array portion 200 of the 1T1C memory cell structure as described for FIG. 2. The array 200 has a plurality of element groupings which operate together in a modular fashion to read and write to memory cells. FIG. 4, for example, shows two element groupings, in which each grouping comprises a sense amplifier (210 or 215) to sense a memory cell associated with a pair of bitlines (B1 220 and B1-bar 222, or B2 224 and B2-bar 226), which is accessed by one of a plurality of word lines (W1–W4) and plate lines (PL–PL), with each word line accessing a 1T1C memory cell 240. One element grouping, for example, comprises a sense amplifier 210, coupled to a pair of bitlines B1 220 and B1-bar 222 through a set of bitline isolation transistors 230 controlled by an isolation switch line 235, to permit isolation from the sense amplifier 210, and a memory cell 240. The 1T1C memory cell 240 is comprised of a pass gate transistor 242 and a ferroelectric capacitor 244, which is accessed by its respective word line 246 and plate line 248.

In the same way, FIG. 5 illustrates an array portion 300 of the 2T2C memory cell structure as described for FIG. 3. The array 300 has a plurality of element groupings which operate together in a modular fashion to read and write to memory cells. FIG. 5, for example, shows two element groupings, in which each grouping comprises a sense amplifier (310 or 315) to sense a memory cell associated with a pair of bitlines (B1 320 and B1-bar 322, or B2 324 and b2-bar 326), which is accessed by one of a plurality of word lines (W1–W4) and plate lines (PL1–PL4), with each word line accessing a 2T2C memory cell 340. One element grouping, for example, comprises a sense amplifier 310, coupled to a pair of bitlines B1 320 and B1-bar 322 through a set of bitline isolation transistors 330 controlled by an isolation switch line 335, to permit isolation from the sense amplifier 310, and a memory cell 340.

The 2T2C memory cell 340 is comprised of a pair of 1T1C type cells, with one coupled to the B1 bitline 320, and the other coupled to the B1 bitline-bar 322. The 2T2C memory cell 340 thus comprises two pass gate transistors and two ferroelectric capacitors. One pass gate transistor 342 is operable to couple ferroelectric capacitor 344 to B1 bitline 320, when accessed by the W1 word line 346, and PL1 plate line 348, while another pass gate transistor 352 is operable to couple ferroelectric capacitor 354 to B1-bar (bitline-bar 322), when accessed by its respective W1 word line 346, and PL1 plate line 348.

Currently, most FeRAM memory arrays apply the 2T2C cell structure of FIG. 5, rather than the 1T1C cell structure of FIG. 4, in part, because of the higher density of sense amplifiers in the 1T1C cell by comparison to the cell area required, as well as difficulties involved with supplying an accurate reference voltage to the sense amplifier of the 1T1C cell. As FeRAM memory cells become smaller, it becomes increasingly difficult to fit the sense amplifier into the same layout size pitch occupied by the memory cells. This problem is especially true of the higher densities of the "open bitline architecture" of the 1T1C cell and is exaggerated further in the dense 1C cell array structure.

As shown by the sensing scheme response plots 400 of FIG. 6, the 2T2C cell sensing scheme 410 is generally easy to implement, as the sense amplifier compares a charge driven from a bitline/bitline-bar at a "1" state 412 with a charge driven from a bitline-bar/bitline at a "0" state 414. The opposite state conditions on the bitline inputs to the sense amplifier eliminate the need for an exacting reference voltage level.

The 2T2C sensing scheme plot 410, begins at a time $t_0$ 416, at a ½ $V_{CC}$ level, where the pass gate transistors (e.g., 342 and 346 of FIG. 5) couple their respective FeRAM capacitors (e.g., 344 and 348 of FIG. 5) to their respective bitlines (e.g., B1 320 and B1-bar 322 of FIG. 5), to produce the bitline charging plots 412 (the "1" state bitline) and 414 (the "0" state bitline), between times to 416 and $t_{SENSE}$ 418. At time $t_{SENSE}$ 418, the charge voltage on the bitlines is affected by the sensing operation of the sense amplifier, and changes the voltages as shown, and as discussed previously. Also as discussed, the states on the memory cells which were read must be re-written into the array, because of this charge altering read operation. However, the 2T2C cell needs twice as much area as the 1T1C cell.

Also shown in the sensing scheme response plots 400 of FIG. 6, is the 1T1C cell sensing scheme plots 420 and 430. The read response to a "1" state sensing operation is illustrated by plot 420, while the read response to a "0" state sensing operation is illustrated by plot 430. The 1T1C cell sensing generally is not easy to implement, as the sense amplifier must compare the read sense charge voltage produced by a target memory cell on one bitline/bitline-bar 422 or 434, to a reference voltage generated on the other bitline-bar/bitline 424 or 432.

The 1T1C sensing scheme plot 420, begins at a time $t_0$ 416, at a ½ VCC level, where the pass gate transistor (e.g., 242 of FIG. 4) couples FeRAM capacitor (e.g., 244 of FIG. 4) to bitline (e.g., B1 220 of FIG. 4), to produce the bitline charging plots 422 (if a "1" state is sensed on the bitline) and 434 (if a "0" state is sensed on the bitline), between times $t_0$ 416 and $t_{SENSE}$ 418. Prior to sensing at time $t_{SENSE}$ 418, a reference voltage must be present, as indicated by line segment 426.

Relative to the "1" state sensing 422 of the plot 420, the reference 426 produced on the bitline opposite the read sensing of the memory cell, must be more negatively offset 428 as shown. Relative to the "0" state sensing 434 of the plot 430, the reference 436 produced on the bitline opposite the read sensing of the memory cell, must be more positively offset 438 as shown. As with the 2T2C cell sensing scheme, at time $t_{SENSE}$ 418, the charge voltage on the bitlines is affected by the sensing operation of the sense amplifier, and changes the voltages as shown, and as discussed previously. Also as discussed, the states on the memory cells which were read must be re-written into the array, because of this charge altering read operation. However, the 2T2C cell needs twice as much area as the 1T1C cell.

Similarly, the prior art DRAM cell sensing schemes of FIG. 7 illustrates the same essential differences between the 2T2C and the 1T1C cell (or the 1C cell) sensing schemes. The sensing scheme response plots 500 of FIG. 7 demonstrate that the 2T2C cell sensing scheme 510 generally is easy to implement, as the sense amplifier compares a charge driven from a bitline/bitline-bar at a "1" state 512 with a charge driven from a bitline-bar/bitline at a "0" state 514. The opposite state conditions on the bitline inputs to the sense amplifier, eliminates the need for generating a reference voltage level, but the 2T2C DRAM cell sensing also requires double the area of the 1T1C cell sensing scheme.

In the 1T1C DRAM, between time $t_0$ 516 and $t_{SENSE}$ 518, the bitline (or bitline-bar) voltage increases or decreases depending on the cell state "1" or "0", respectively. During this same time, reference voltage $V_{REF}$ of the bitline-bar (or the bitline) remains unchanged at the precharge level. Therefore, the sense amplifier connected to the bitline and bitline-bar can sense a "1" or "0" state by detecting the voltage difference between the two bitlines. In the case of the FeRAM, both the "1" and the "0" states will give the same direction voltage change, but with differing magnitudes. Therefore, the DRAM as well as the FeRAM memory cell demonstrate the same need for a reference voltage.

1C cell sensing generally works the same as the 1T1C cell sensing operation.

Another prior art sensing scheme uses FeRAM "reference cells" or "dummy cells". The dummy cell includes 2 ferroelectric capacitors (FeCaps) that are fabricated generally identically to each other and to the array of memory cells. Dummy cells operates by charging one of the two FeCaps to a "1" state, and charging another to a "0" state, and allowing the two FeCaps to be coupled to a bitline and to charge share to create a reference voltage which is substantially half of that developed by a ferroelectric memory cell. Dummy cells are only needed for certain memory cells, such as the 1T1C memory cells, that are not self-referenced, as with the DRAM or the 2T2C FeRAM sensing scheme.

Thus, conventional 2T2C FeRAM sensing schemes use excessive area for the applications considered. By contrast, conventional 1T1C and 1C cell sensing schemes, may use only half the area of the 2T2C cell, but require a means for generating an accurate reference voltage, and a more complex means of sensing. 1C cells require less area than the 1T1C cell, but as FeRAM cells become smaller, these cell sensing schemes tend to produce a density of sense amplifiers which may be beyond leading edge processes or interconnection methods.

Accordingly, there is a need for a simple sensing scheme for an FeRAM array of memory cells, which permits the high density use of a 1T1C and 1C cell structure in a small low power solution.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The invention is directed to a ferroelectric memory device for the 1T1C and 1C cell arrangement in an array of ferroelectric capacitor memory cells used in FeRAM memory applications. In particular, the device structure provides a system and method of sharing a sense amplifier, a data buffer, and dummy cells between several segments of an array. Segment groupings of the segmented array use the same word lines and plate lines. A target (selected) memory cell of an FeRAM array is tied to segmented local bitlines by segmentation switches which separate the local bitlines from main bitlines. The sense amplifier is connected to common bitlines (also known as "sub-I/O lines") which use T-gate select switches to share the sense amp between memory cell arrays. A data buffer is further connected to the sub-I/O lines by DB/sub-I/O select switches. Further, the data buffer may have DB/main I/O select switches which allow several sense amplifier banks to share the same data buffer. Finally, the simple sensing scheme uses the shared sense amplifier for reading the state of the target memory cell of an FeRAM array.

In the 1T1C cell arrangement, the array of FeRAM memory cells store binary data in a ferroelectric capacitor, which is accessed by a transistor in the usual manner. In the 1C cell arrangement, the array of FeRAM memory cells store the binary data in a ferro-electric capacitor, and takes great advantage of the array segmentation to minimize local bitline capacitance. Without the level of array segmentation which is described herein, the high level of memory cell density of the 1C cell may not be made possible, or at least practical without other major process, transistor, or interconnection advances.

The 1C cell has the obvious advantage of requiring one less access/isolation transistor and the accompanying smaller silicon area, but because the capacitor can not be isolated from the local bitline segment, there is a capacitance and cell quantity limit to each segment. Both of the single capacitor memory cell types (1T1C and 1C) require less silicon area than the dual capacitor type, thereby increasing the potential density of the memory array.

Conventional FeRAM memory devices using 2T2C FeRAM sensing schemes require nearly twice the area on chip, and therefore use excessive area for the applications considered. On the other hand, conventional 1T1C cell sensing schemes require only half the area, but require a mechanism for generating a reference voltage, and a more complex sensing scheme. Additionally, conventional 1T1C and 1C cell arrays have many cells in a row associated with a fixed sense amplifier. The conventional sense amplifier arrangement may therefore limit the ultimate density of the cells obtainable in the array.

Consequently, the solution according to the present invention is to segment the array in a bit line direction and/or a word line direction, wherein bit lines are segmented and word lines may also be segmented. Two-dimensionally segmenting the array allows us to share sense amplifiers, data buffers, and dummy cells among array segments and between arrays, and to share data buffers among banks of sense amplifiers. Further, the two-dimensional sharing permits a reduction in the number of sense amps and data buffers, which facilitates a denser cell array structure in the 1T1C or the 1C cell arrangement. Sharing the dummy cells also permits reductions, or at least modular use of dummy cells to make a reference circuit to generate the reference voltage for the sense amplifier. The reference voltage is applied to one of the bitline inputs of the sense amplifier, and a sense voltage produced by the target memory cell is applied to the other bitline input of the sense amplifier. The sense amplifier can then accurately determine from the differential voltage, the state of the FeRAM memory cell.

According to an aspect of the invention, a segment decode logic may be used to select bit line direction and word line direction segments to address a target segment associated with a target memory cell and a bitline which is local (local bitline) to the target memory cell. Conventional word line and plate line cell decode logic may be used to select the target FeRAM memory cell to be read within the selected target segment. Within the target array segment, selecting the word lines and plate lines accesses signal charge from the target memory cell. The reference circuit generates a reference voltage which is a function of a voltage and precharge applied to the dummy cells. A shared sense amplifier receives the cell sense voltage from the selected target memory cell on an associated bitline, and the reference voltage is received on another bitline input of the sense amplifier. Thus, a ferroelectric memory structure provides a simple sensing scheme for the logic state of a 1T1C or a 1C cell in a high density array of FeRAM memory cells.

In another aspect of the invention provides a system and method of sharing a sense amp, a data buffer and dummy cells in either an open bitline or a folded bit line architecture.

According to another aspect of the invention, the method of the ferroelectric memory device is operable for both the read and write operations of a FeRAM memory cell.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
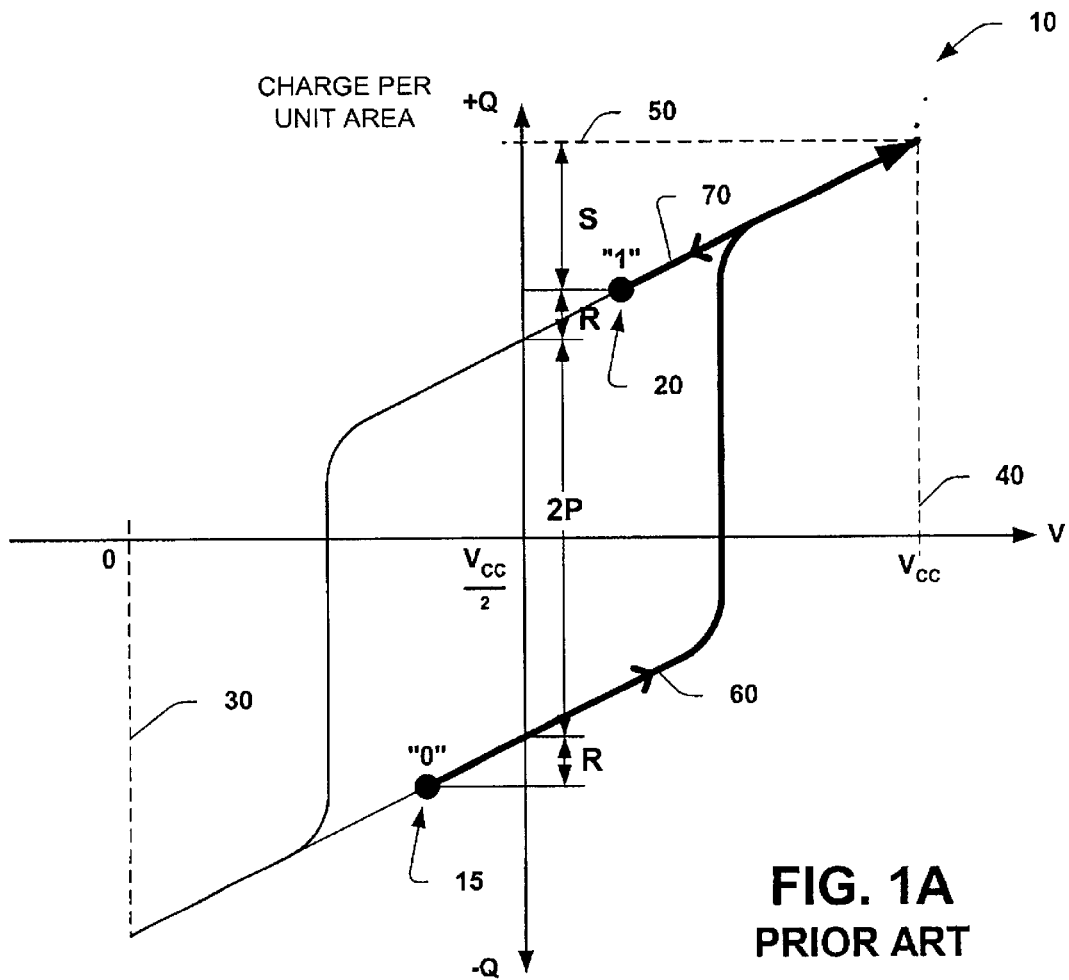
FIG. 1A is a characteristic curve plot of a prior art Ferroelectric capacitor, illustrating the charge "Q" (y-axis) and the voltage "V" (x-axis), including the characteristic placement relationship of a "1" state and a "0" state in a typical FeCap.
Figure 1B:
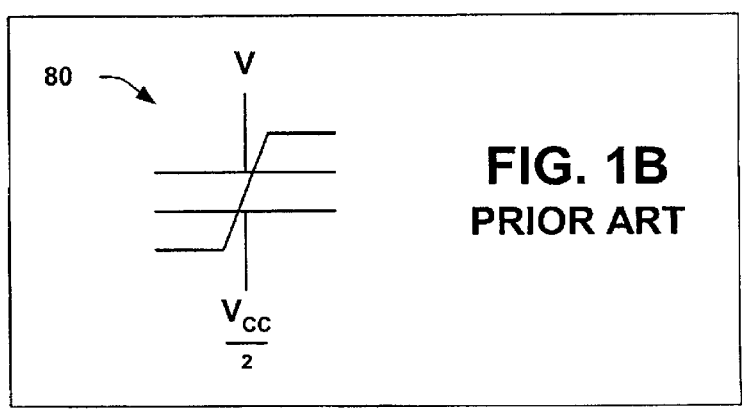
FIG. 1B is an accompanying schematic symbol of the prior art Ferroelectric capacitor of FIG. 1A, and the typical $\frac{1}{2}V_{CC}$ polling voltage applied to the plate line.
Figure 2:
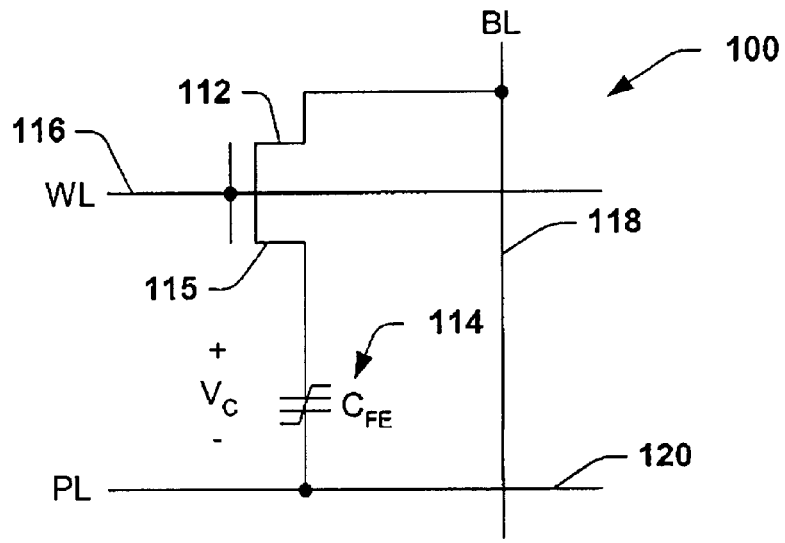
FIG. 2 is a partial schematic illustrating a prior art 1T1C FeRAM cell, comprising one transistor and one Ferroelectric capacitor.
Figure 3:
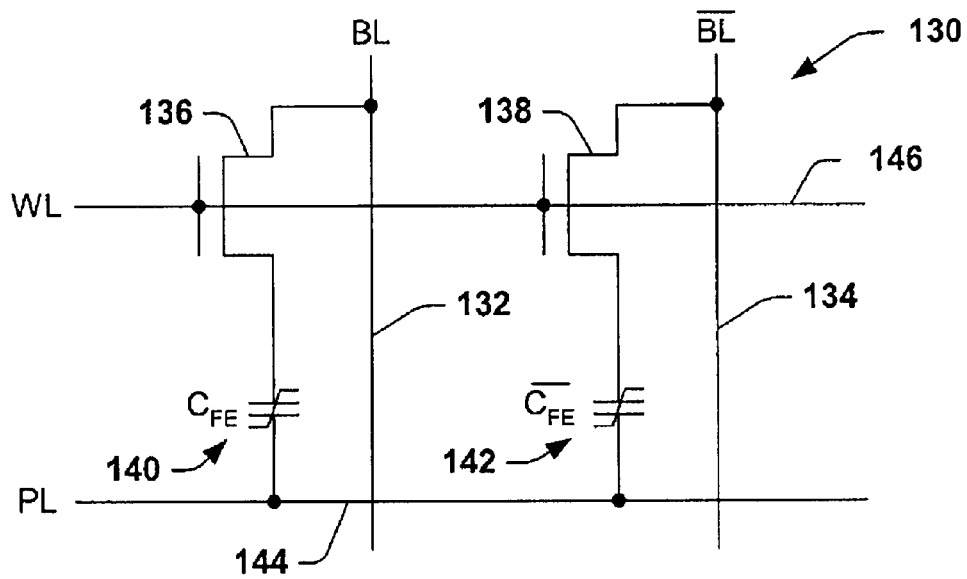
FIG. 3 is a partial schematic illustrating a prior art 2T2C memory cell comprising two transistors and two Ferroelectric capacitors.
Figure 4:
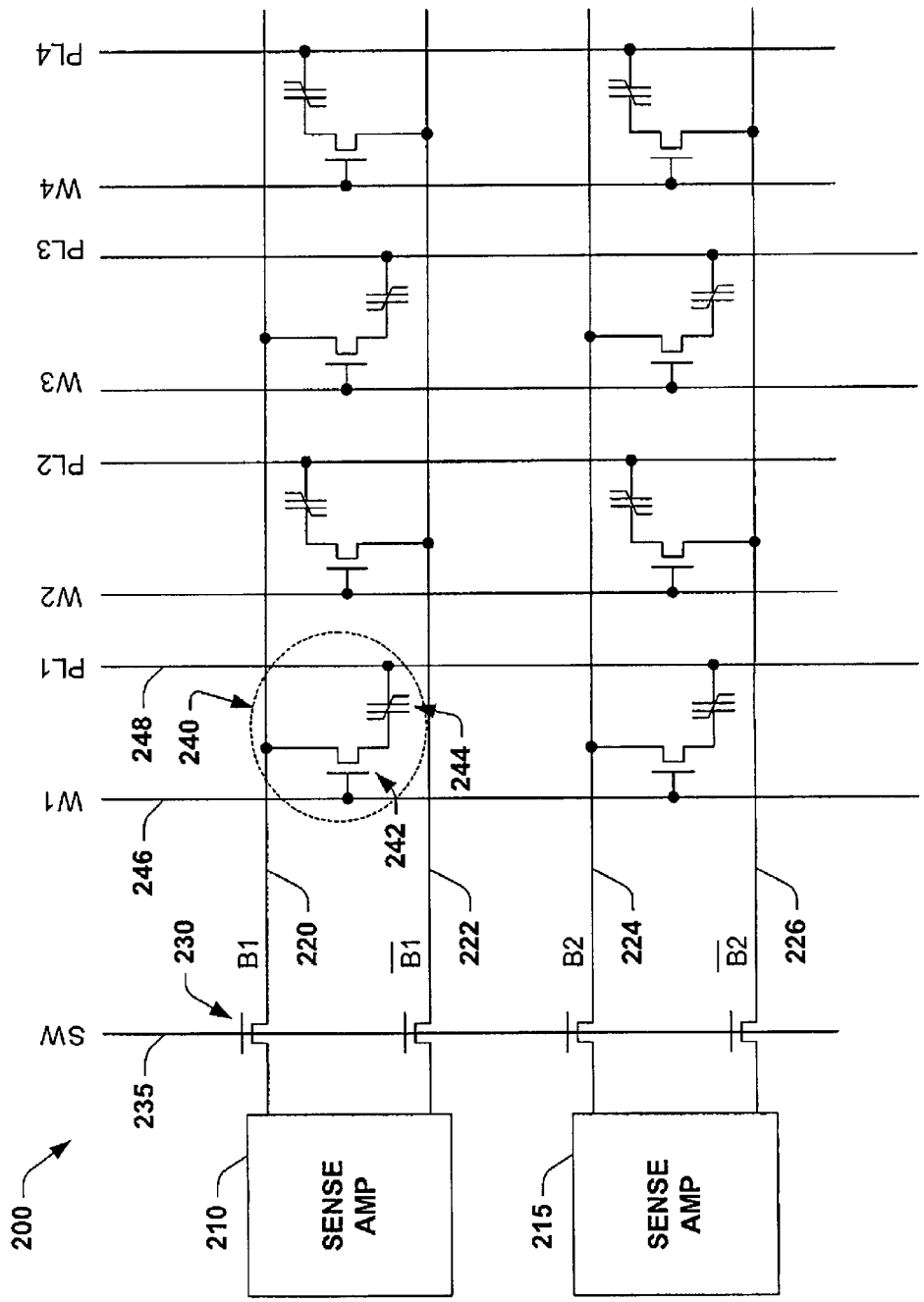
FIG. 4 is a simplified schematic illustrating an array portion of the 1T1C memory cell structure as described for FIG. 2.
Figure 5:
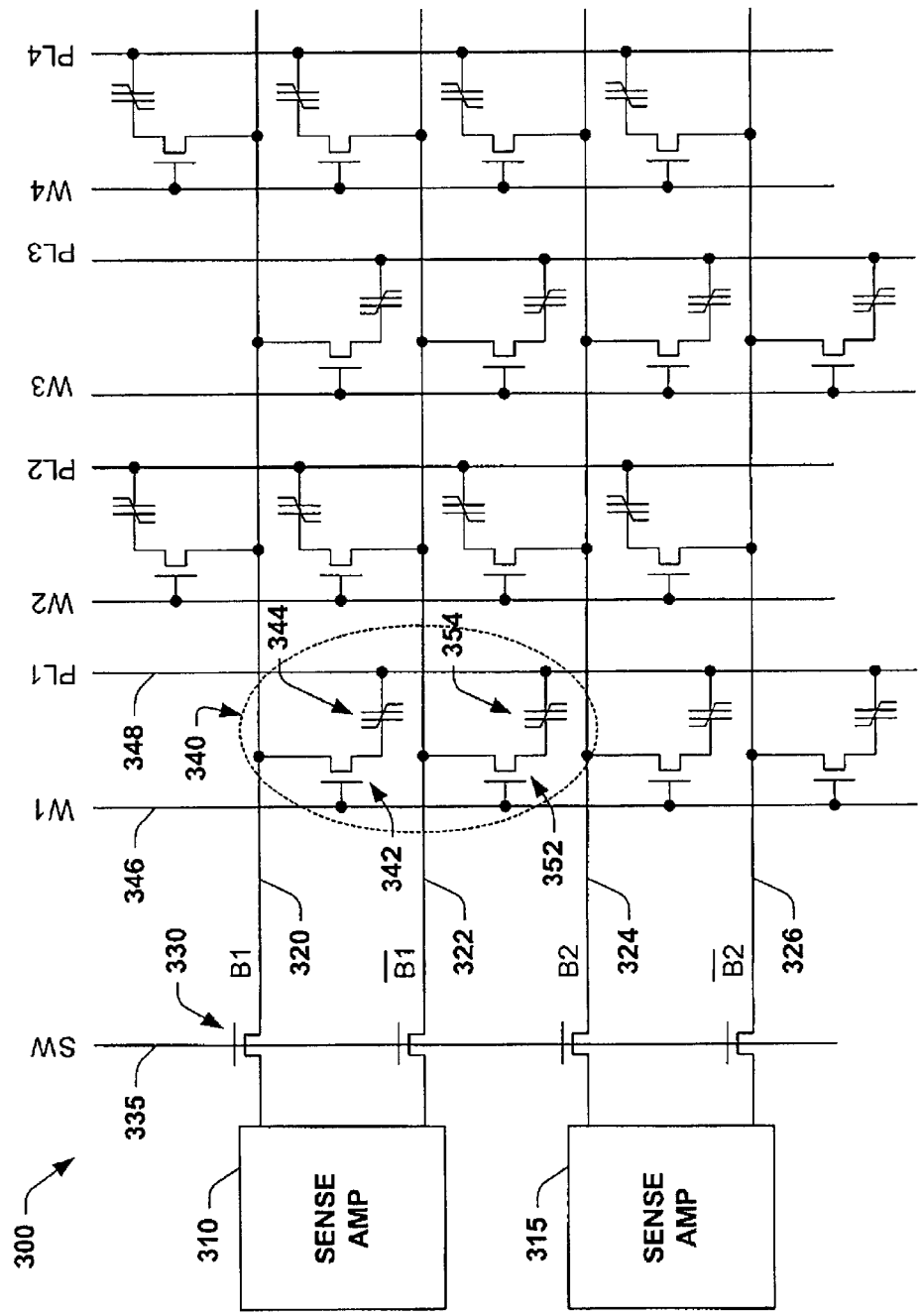
FIG. 5 is a simplified schematic illustrating an array portion of the 2T2C memory cell structure as described for FIG. 3.
Figure 6:
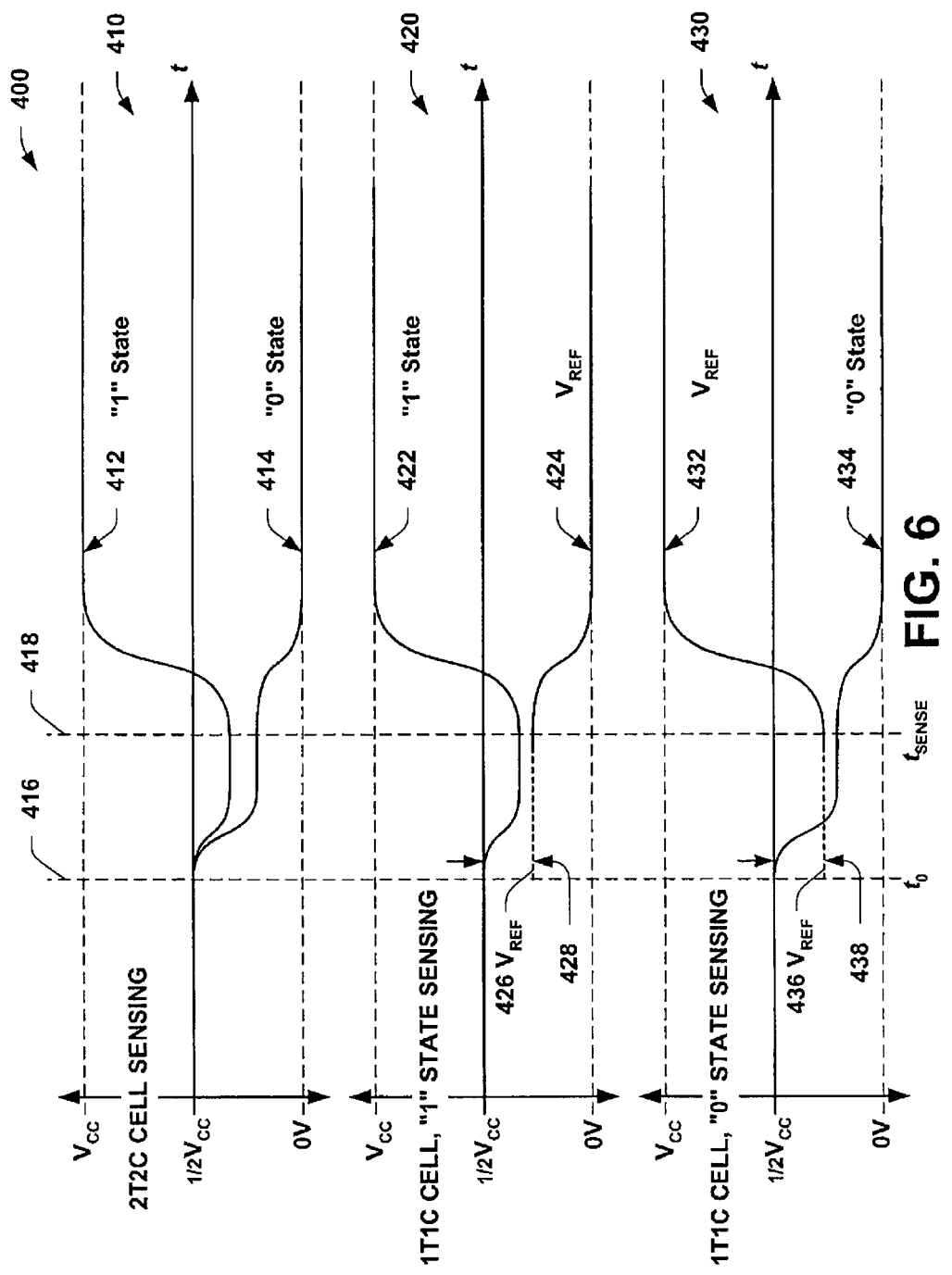
FIG. 6 illustrates exemplary sensing response plots of prior art FeRAM sensing schemes, of 2T2C cell sensing, 1T1C cell "1" state sensing, and 1T1C cell "0" state sensing.
Figure 7:
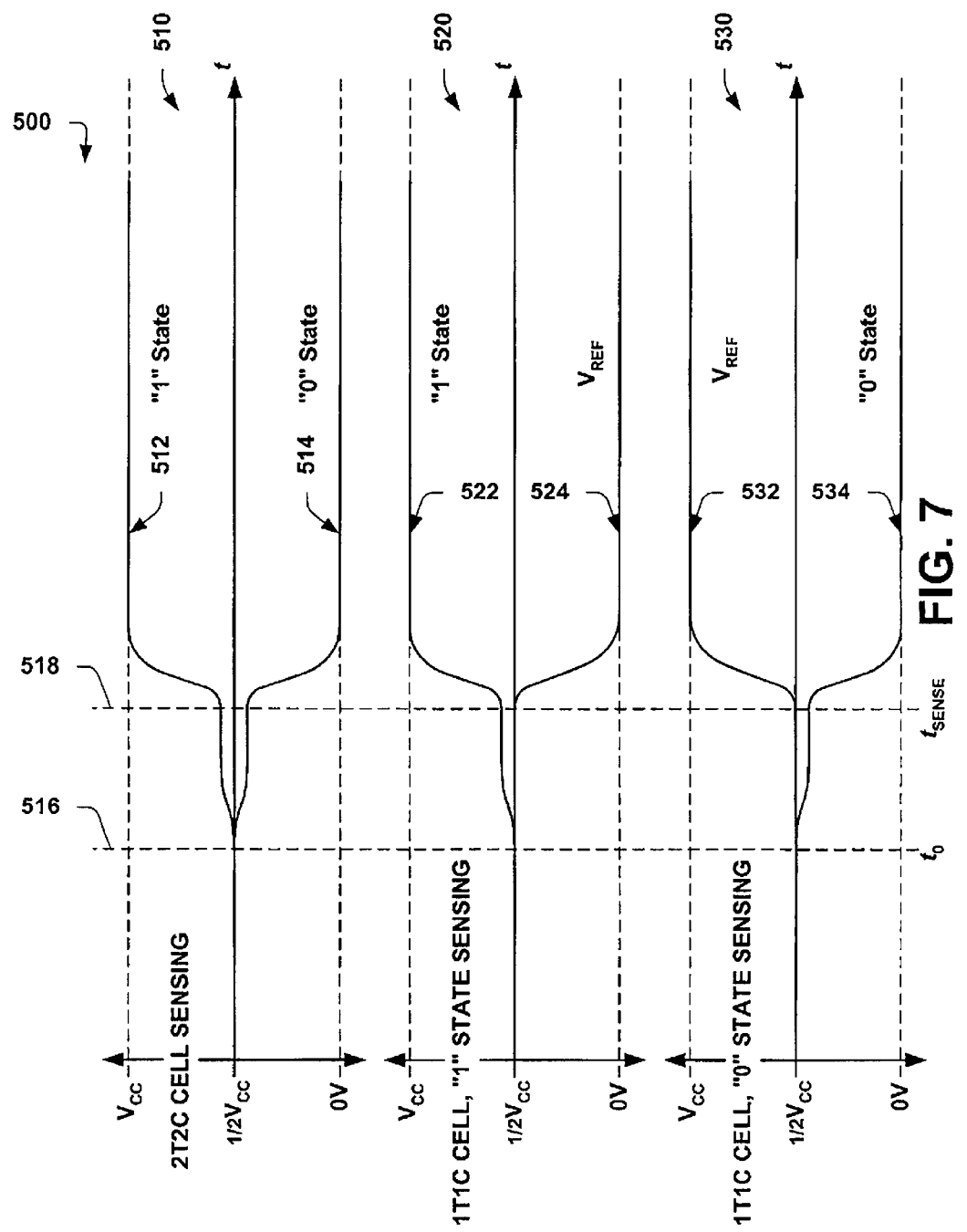
FIG. 7 illustrates exemplary sensing response plots of prior art DRAM sensing schemes, of 2T2C cell sensing, 1T1C cell "1" state sensing, and 1T1C cell "0" state sensing.

The present invention will now be described with reference to the drawings, wherein like reference numerals are used to refer to like elements throughout. The invention is directed to a ferroelectric memory device for the 1T1C and 1C cell arrangements in an array of ferroelectric capacitor memory cells used in FeRAM memory applications. In particular, the device structure provides a system and method of sharing a sense amplifier, a data buffer, and dummy cells between several segments of an array. Segment groupings of the segmented array, use the same word lines and plate lines. A target (selected) memory cell of an FeRAM array is tied to segmented local bitlines by segmentation switches which separate the local bitlines from main bitlines. The sense amplifier is connected to common bitlines (also known as "sub-I/O lines") which use T-gate select switches to share the sense amp between memory cell arrays. A data buffer is further connected to the sub-I/O lines by DB/sub-I/O select switches. Further, the data buffer may have DB/main I/O select switches which allow several sense amplifier banks to share the same data buffer. Finally, the simple sensing scheme uses the shared sense amplifier for reading the state of the target memory cell of an FeRAM array.

Array segmentation is referred to in a general way here, as array segmentation may be divided into two basic aspects: bit line segmentation and word line segmentation. Bit line segmentation generally refers to segmentation of the bit lines within and between arrays, or segmentation of the array in the bit line direction. Word line segmentation generally refers to segmentation of the word lines within and between arrays, or segmentation of the array in the word line direction.

The use of the 1T1C and particularly the 1C FeRAM memory array and the beneficial array segmentation aspects of the present invention make possible a small size FeRAM memory.

According to one aspect of the present invention, the array is subdivided by segmenting the array in a bit line direction, wherein the segments are selected and coupled to a local bit line or bit line bar (BL/BL). Bit line direction segmentation provides a means of using an open bit line architecture of the denser 1T1C or 1C cell types providing a smaller memory size. Bit line direction segmentation also provides a means of sharing a sense amplifier between more cells of an array via a plurality of segments, as well as sharing the sense amp between a plurality of arrays via segmented bitlines. By sharing the sense amp between more cells, the area required by the sense amp may become less of a factor limiting the bit line pitch and therefore the final memory size. Bit line direction segmentation further provides a reduced bitline capacitance because fewer cells are coupled to the bitline at any one time, and the bitline may therefore be shorter. With a reduced bitline capacitance, faster access times and reduced read/write/restore power consumption may be realized.

According to another aspect of the present invention, segmenting pairs of bit lines which couple a plurality of arrays provides a mechanism of sharing a sense amplifier, a data buffer, and the dummy cells of a reference circuit between the plurality of arrays in a bit line direction. Bit line direction segmentation of the bit lines further provides a reduced capacitance of the bitline because fewer cells are coupled to the bitline at any one time, and the bitline may therefore be shorter. With a reduced bitline capacitance, faster access limes, and reduced read/write/restore power consumption may again be realized.

According to yet another aspect of the present invention, the array is subdivided by segmenting the array in a word line direction, wherein word lines are segmented between a plurality of arrays in the word line direction providing a means of sharing a data buffer among banks of sense amplifiers. Word line direction segmentation may also provide a means of using an open bit line architecture of the more dense 1T1C or 1C cell types providing a smaller memory size.

According to yet another aspect of the present invention, the array is subdivided by segmenting the array in a bit line direction and a word line direction. The array segments are selected and coupled to a local BL/BL by segment select switches, while pairs of BL/BLs are segmented to couple between a plurality of arrays in the bitline direction with T-gate select switches providing a means of sharing a sense amplifier, a data buffer, and the dummy cells of a reference circuit between the plurality of arrays in the bit line direction. Word lines are segmented between pluralities of arrays in the word line direction by word line select switches providing a means of sharing a data buffer among banks of sense amplifiers. Thus, two-dimensional segmentation of the array allows more extensive sharing of the sense amplifiers, data buffers, and dummy cells among array segments and between arrays. More sharing permits a reduction in the number of these shared circuits thereby facilitating the use of a denser cell array structure such as the 1T1C or the 1C cell arrangement, which provides for a smaller memory size.

Sharing the dummy cells may optionally permit reductions in the making of a reference circuit which generates a reference voltage for the sense amplifier. The reference voltage is applied to one of the bitline inputs of the sense amplifier, and a sense voltage produced by the target memory cell is applied to the other bitline input of the sense amplifier. The sense amplifier can then accurately determine from the differential voltage, the state of the FeRAM memory cell. Two (e.g., FeCap, MOS-C, or metal-to-metal) capacitors in the reference circuit provide coupling of a dummy cell charge to either one of the bitlines to generate the reference voltage for the sense amplifier in one example.

In accordance with the invention, several implementations of the ferroelectric memory device and sensing scheme will be discussed. Generally, the schemes attempt to share more of several specific circuits by way of segmentation of an array, or pluralities of arrays associated with a target memory cell in a bit line direction and a word line direction to permit a reduction in the number of these shared circuits and facilitate the use of the more dense 1T1C or 1C cell types which may provide a smaller memory size.

Figure 8A:
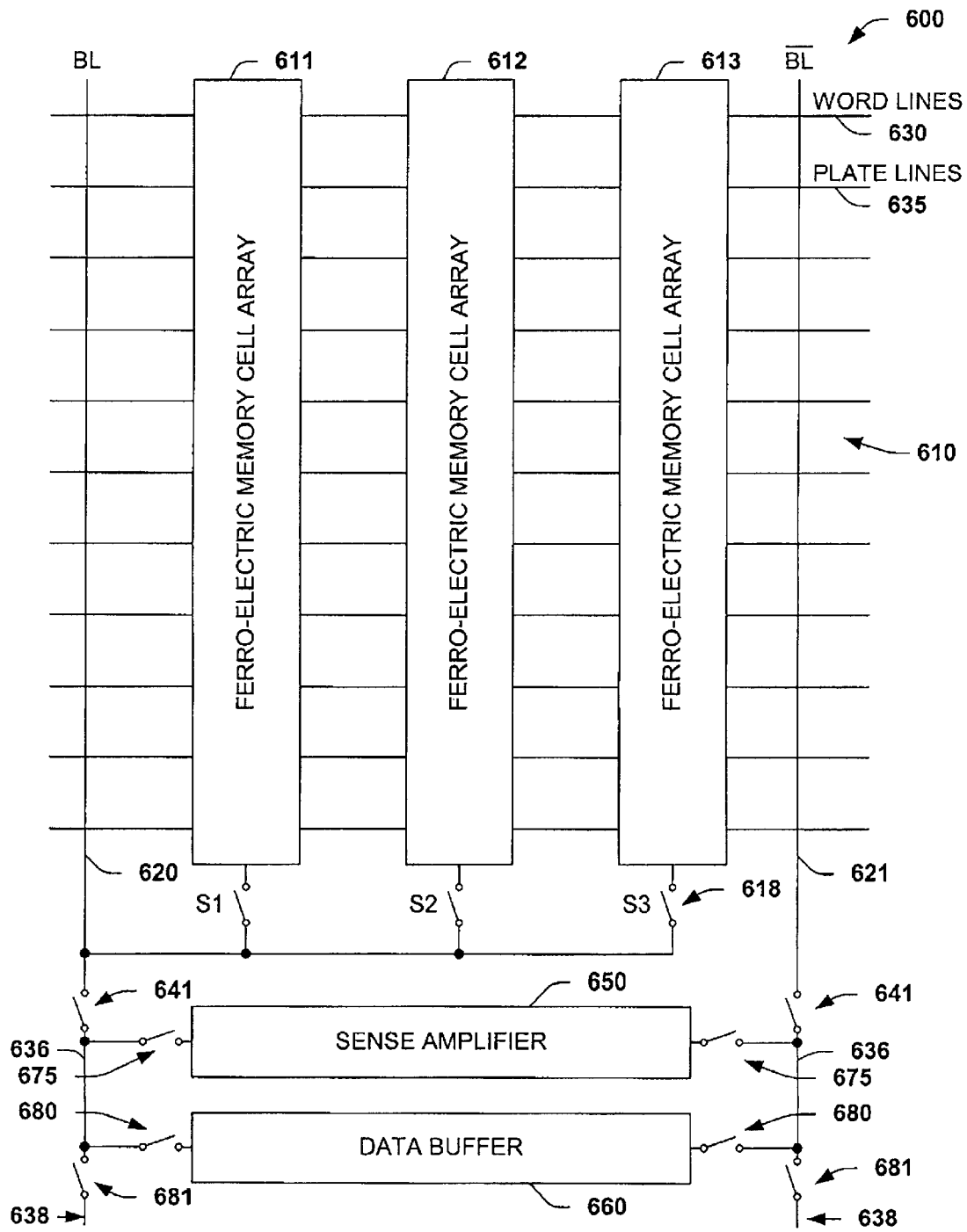
FIG. 8A is a simplified block diagram of an exemplary shared sense amplifier concept for a ferro-electric memory cell sensing scheme using an array of memory cells segmented into three (3) segments in a ferroelectric memory device in which various aspects of the present invention may be carried out.

FIG. 8A is a simplified block diagram 600 of an exemplary shared sense amplifier concept for a ferro-electric memory cell sensing scheme comprising an array 610 of memory cells which is subdivided "segmented" into three (3) array segments. Diagram 600 illustrates a ferroelectric memory device in accordance with an aspect of the present invention, wherein a corresponding segment select switch S1, S2, or S3 (618) may individually select three (3) array segments 611, 612, and 613, respectively. Each segment select switch is operable to couple the associated array segment to one of a local bitline 620, or a bitline-bar 621 associated with the array segments.

Word lines 630 and plate lines 635 may access a selected target memory cell in one of the three array segments. The bitline pair BL/BL 620, 621 local to the array segments is also segmented and coupleable to sub-I/O lines 636 with T-gate select-1 switches 641. Sub-I/O lines 636 are common to a shared sense amplifier 650 for sensing the state of a target memory cell, and to a shared data buffer 660 for storing data for the target memory cell (for subsequent write-back since data reads are destructive). The sense amplifier 650 may be coupled to the sub-I/O lines 636 with SA/sub-I/O select switches 675, while the data buffer 660 may be coupled to the sub-I/O lines 636 with DB/sub-I/O select switches 680. Sub-I/O lines 636 are also segmented and coupleable to another array which is local to bit lines 638 with another set of T-gate select-2 switches 681, to further extend the sharing in the bit line direction.

Figure 8B:
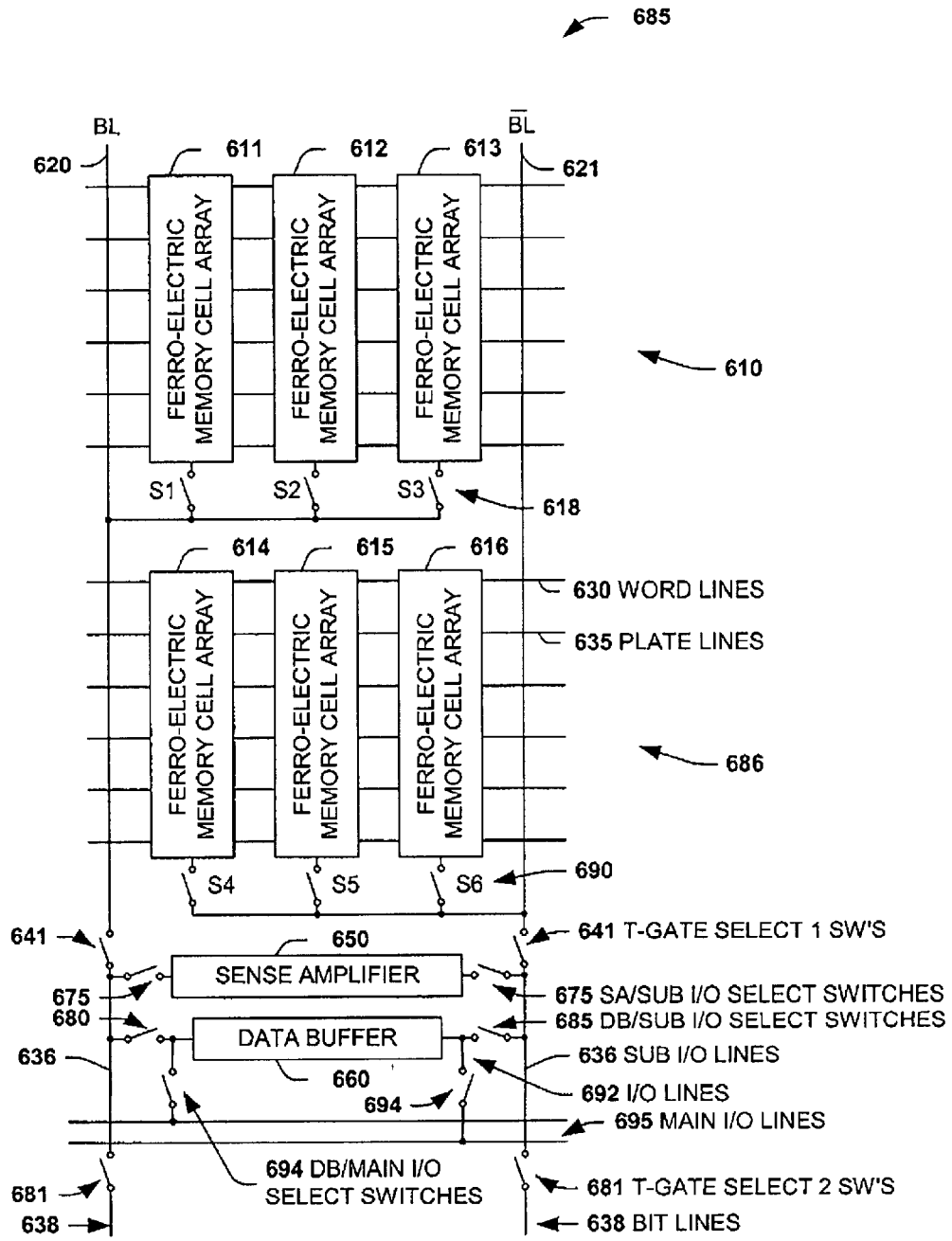
FIG. 8B is another block diagram of an exemplary shared sense amplifier architecture for a ferro-electric memory cell sensing scheme using a six (6) segmented array of memory cells of a ferroelectric memory device, illustrating segment selection switches coupleable to both BL/BL bitlines, sense amp and data buffer selectability to other array bitlines and to I/O lines, and demonstrating the concept of bit line direction segmentation in which various aspects of the present invention may be carried out.

FIG. 8B is another block diagram 685 of an exemplary shared sense amplifier concept for a ferro-electric memory cell sensing scheme extending the concept of FIG. 8A comprising 2 arrays 610 and 686 of 3 segments each. Block diagram 685 illustrates a ferroelectric memory device in accordance with another aspect of the present invention demonstrating the concept of bit line direction segmentation in which various aspects of the present invention may be carried out. Again, array 610 of 3 segments 611, 612, and 613 may be individually selected by a corresponding segment select switches S1, S2, or S3 (618), respectively.

Further, another array 686 comprising three (3) array segments 614, 615, and 616 may be individually selected by a corresponding segment select switch S4, S5, or S6 (690), respectively. Again, each segment select switch is operable to couple the associated array segment to one of a local bitline 620, or a bitline-bar 621 associated with the array segments. In this example, array 610 is associated with, and coupled to BL 620, via select switches 618, while array 686 is associated with, and coupled to BL 621, via select switches 690.

Word lines 630 and plate lines 635 may access a selected target memory cell in one of the three array segments of each of the two arrays 610 and 686. The bitline pair BL/BL 620, 621 local to the array segments is also segmented and coupleable to sub-I/O lines 636 with T-gate select-1 switches 641. Sub-I/O lines 636 are common to a shared sense amplifier 650 for sensing the state of a target memory cell, and to a shared data buffer 660 for storing data for the target memory cell in either array 610 or array 686. The sense amplifier 650 may be coupled to the sub-I/O lines 636 with SA/sub-I/O select switches 675, while the data buffer 660 may be coupled to the sub-I/O lines 636 with DB/sub-I/O select switches 680. Sub-I/O lines 636 are also segmented and coupleable to another array which is local to bit lines 638 with another set of T-gate select-2 switches 681, to further extend the sharing in the bit line direction.

Additionally, in another aspect of the invention, the data buffer 660 may present data on a pair of I/O lines 692 which may be coupled via DB/Main-I/O select switches 694 to Main-I/O lines 695 thus, providing for the transfer or sharing of data with a plurality of other arrays in the word line direction.

Figure 9:
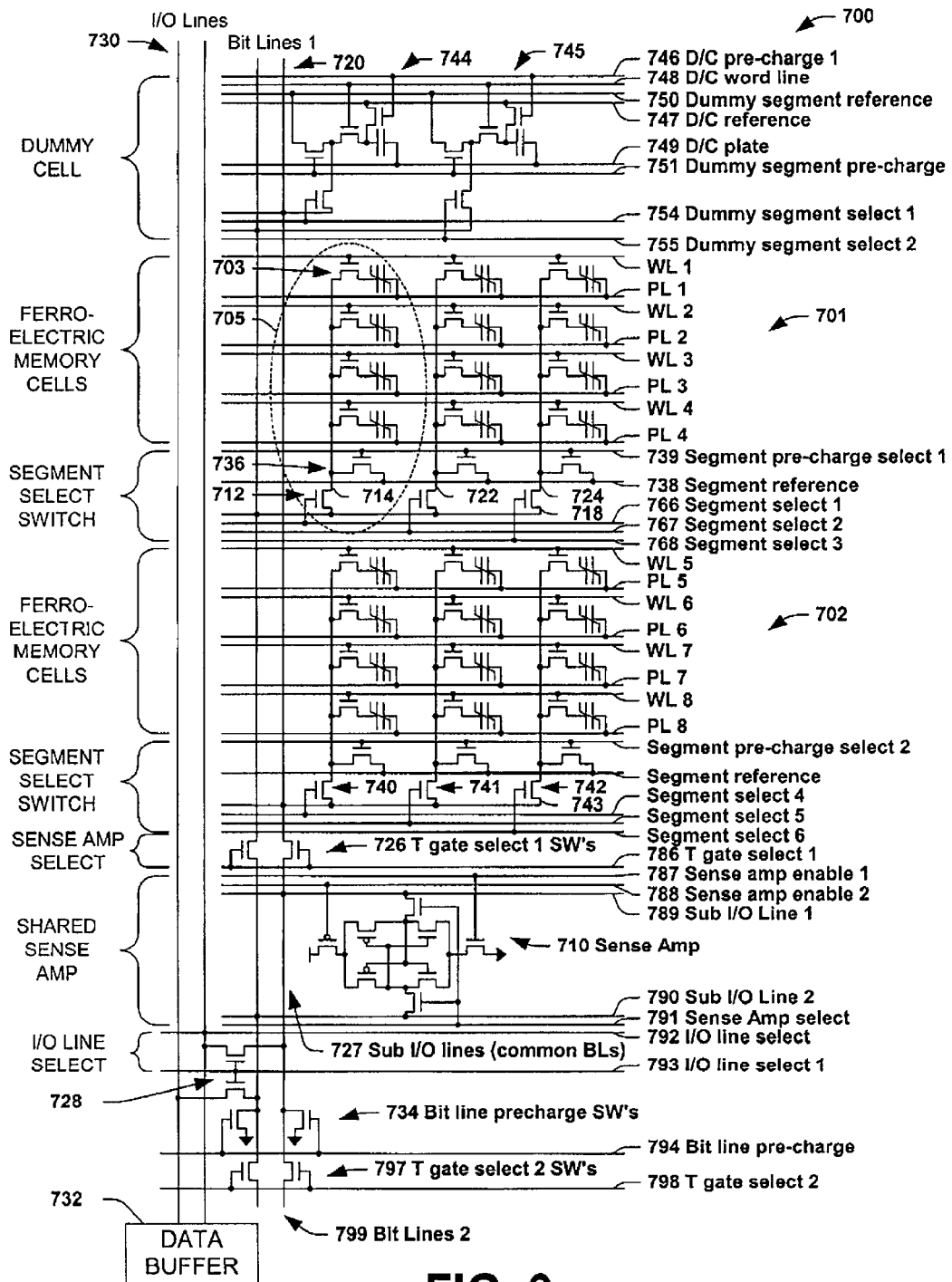
FIG. 9 is a schematic diagram illustrating an FeRAM array portion of an exemplary shared sense amp sensing scheme, wherein a sense amp, a data buffer, and dummy cells are shared among array segments and among arrays in a 1T1C FeRAM memory cell structure as shown in FIG. 8B, according to an aspect of the present invention.

FIG. 9 is a schematic diagram of an exemplary circuit for the FeRAM array of the shared sense amp sensing scheme of FIG. 8B. Sample circuit 700 comprises 2 arrays of 3 segments each. A first array 701 has segments 1, 2, 3, and a second array 702 has segments 4, 5, 6, respectively. Both arrays share a sense amp 710, a data buffer 732, and dummy cells among the 2 arrays and the 6 array segments of the 1T1C FeRAM memory cell structure as shown in FIG. 8B, according to an aspect of the present invention.

A target memory cell 703 is selected within a target array segment 705 to be sensed by the sense amplifier 710 to determine the logic state of the cell 703. First array 701 segment 705 is selected by segment select switch 712 (S1 compares to 618 of FIG. 8B) coupling 4 memory cells of segment 705 on segment bitline node S1 (714) to a segment common node 718 which is connected to one of the array local bitlines 1 (720). Although segment 705 illustrates 4 memory cells, the segment may also contain another binary number of cells (e.g., 4, 8, 16) memory cells. Similarly, memory cells of a second segment on segment bitline node S2 (722) are coupled to the segment common node 718 and one of the array local bitlines 1 (720). Finally, memory cells of a third segment on segment bitline node S3 (724) are coupled to the segment common node 718 and one of the array local bitlines 1 (720). Segment select switches S1, S2, and S3 (712) are NMOS transfer gate switches in the exemplary sample circuit, using a boosted gate voltage. A CMOS transfer gate may also be used if the added size is not a significant issue.

Although sample circuit 700 describes 2 arrays comprising 3 segments each, these segments could also be described as 6 segments of 1 array which are associated with the array local bitlines 1 (720). In addition, T-gate select 1 switches 726 couple the array local bitlines 1 (720) to the sense amp 710, which is shared with all the cells and bitline segments of the 6 array segments via the common bitlines "sub I/O Lines" 727. Sub I/O Lines" 727 also provide common bitlines for coupling via DB/sub I/O select switches 728 to I/O lines 730 which are the inputs and outputs of a shared data buffer 732.

Bitline precharge switches 734 initially short to ground to provide a 0 Volt precharge on the common sub I/O Lines 727.

Transistor 736 precharges bitline node S1 (714) of segment 705 to a segment reference voltage on segment reference 738 when enabled by segment pre-charge select 1 (739).

In the same way, the second array 702 comprising segments 4, 5, and 6 are selected via segment select switches S4 (740), S5 (741), and S6 (742), respectively. Thus memory cell data on bitline nodes the associated with these segment select switches may be coupled and transferred to a segment common node 743 which is connected to one of the array local bitlines 1 (720).

A reference circuit comprising two dummy cells 744 and 745, places a reference voltage on one of the array local bitlines 1 (720) for use by the shared sense amp. A high on dummy cell precharge 1 (746) switches a transistor within each of the dummy cells, coupling a reference voltage on dummy cell reference 747 to charge a capacitor within each of the dummy cells. These dummy cell capacitors may, for example, be an FeRAM, MOS-C, or a metal-to-metal type capacitor.

A dummy word line 748 provides word line addressing for both dummy cells, while the plates of the dummy cells are addressed by dummy cell plate line 749. A dummy segment reference 750 may also be used to precharge the dummy cell capacitors when switched by dummy segment precharge 751 at the gate of another transistor within the dummy cells. Finally dummy cell 744 is selected and coupled to one (e.g., the BL) of the array local bitlines 1 (720) by dummy segment select 1 (754), while dummy cell 745 is selected and coupled to another (e.g., the BL) of the array local bitlines 1 (720) by dummy segment select 2 (755).

1T1C FeRAM Memory cell 703 comprises an access transistor and an FeCap. Part of memory cell 703 of segment 1 is selected by a high level input at word line 1 (WL1) to the gate of the access transistor, and a high on plate line 1 (PL1) to the plate of the FeCap. As shown by FIG. 9, when WL1 and PL1 receive a high input, all 3 memory cells (viewing horizontally) attached to these lines will present their respective data to the associated segment bitline nodes S1 (714), S2 (722), and S3 (724). However, only the selected segment (via a selected segment select switch) will be coupled to the segment common node 718 to transfer data to one of the array local bitlines 1 (720).

Thus a target memory cell has a unique word line, plate line, and segment select switch for addressing and accessing data of the target cell. Other memory cells of array 701 with segments 1, 2, and 3, and array 702 with segments 4, 5, and 6 are selected in the same way, by selecting a word line, a plate line, and a segment associated with the target memory cell.

To select each of the segments of the arrays 701 and 702, segment select lines are enabled to the segment select switches. For example, a high is applied to segment select 1 (766) to cause the transfer gate for segment select switch S1 (712) to conduct and couple data from any of the memory cells in segment one to the segment common node 718 to one of the array local bitlines 1 (720). Similarly, segment select 2 (767) selects segment 2, and segment select 3 (768) selects segment 3.

Array 702 operates in the same way as array 701, for selecting segments 4, 5 and 6, for precharging the segments and for addressing the memory cells, therefore needs no further explanation in these areas.

T-gate select 1 (786) enables T-gate select 1 switches 726 to couple the local bitlines segment 720 to the sub I/O Lines 727 common BL segment to share the sense amp 710. Sense amp enable 1 (787) and sense amp enable 2 (788) enable and couple the $V_{CC}$ and ground power respectively, to the sense amp 710. Sub I/O line 1 (789) is common with one of the sub I/O Lines and the line 1 input of the sense amp 710, while Sub I/O line 2 (790) is common with the other of the sub I/O Lines and the line 2 input of the sense amp 710. Sense amp select 791 enable the sense amp to begin functioning as a differential amplifier, sensing the signals present on the common sub I/O Lines 727.

When data has been sensed by the sense amplifier 710, and is ready to be stored in the data buffer 732, DB/sub I/O select switches 728 are enabled with I/O line select 792 and I/O line select 1 (793), thereby coupling the sub I/O lines 727 to the I/O lines 730 which are the combination inputs and outputs of the data buffer 732 for the transfer and sharing of data with the sense amp 710.

Common and local bitlines of the arrays associated with the shared sense amp 710 and data buffer 732 are precharged to ground when the gates of the bitline precharge switches 734 receive a high input from bitline precharge 794.

Additional arrays (not shown) may share the sense amp and data buffer of FIG. 9, by selecting another set of T-gate select 2 switches 797 via a T-gate select 2 (798) gate input, which couples the sub I/O lines 727 to another pair of local bitlines 2 (799). Local bitlines 2 (799), may also have, for example, 2 more arrays as illustrated by arrays 701 and 702.

The operation of the sample circuit of FIG. 9, for the 1T1C FeRAM array of the shared sense amp sensing scheme of FIG. 8B, will be described through the read and write/restore operations which follow.

Figure 10:
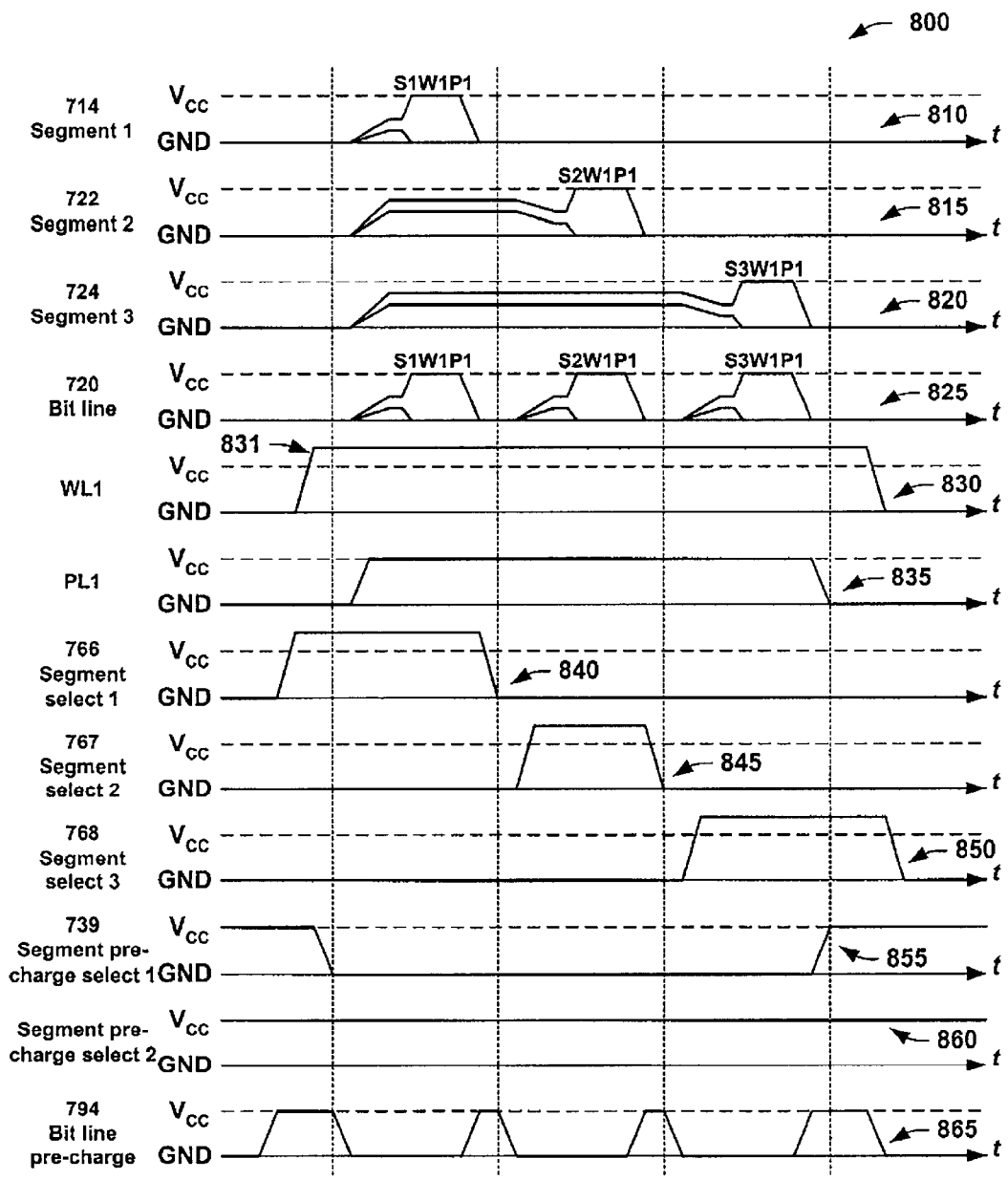
FIG. 10 is a timing diagram for the read operation of the shared sense amp sensing scheme circuit of FIG. 9 for the 1T1C FeRAM array, wherein an exemplary memory cell from each of the three (3) segments of an array is read sensed, according to an aspect of the present invention.

FIG. 10 is an exemplary timing diagram 800 for the read operation of the shared sense amp sensing scheme for the sample circuit of FIG. 9. In particular the timing diagram 800, illustrates the read operation of an exemplary 1T1C FeRAM memory cell from each of 3 segments of array 701, according to an aspect of the present invention. For simplicity, WL1 and PL1 address lines will be used for sensing a memory cell within each of the three segments, along with the specific segment select, but it should be appreciated that any WL and PL pair associated with the target cell could be used.

For example, plot 810 illustrates the read sense response as seen at the segment 1 BL node 714 for the memory cell addressed at S1 (segment 1), WL1, and PL1, or "S1W1P1". Plot 815 illustrates the read sense response as seen at the segment 2 BL node 722 for the memory cell addressed at S2 (segment 2), WL1, and PL1, or "S2W1P1". Plot 820 illustrates the read sense response as seen at the segment 3 BL node 724 for the memory cell addressed at S3 (segment 3), WL1, and PL1, or "S3W1P1". Plot 825 illustrates the read sense response as seen at the local bit lines 720 for all three memory cells as they are addressed in sequence at S1, WL1, PL1 for the first cell read, S2, WL1, PL1 for the second cell read, and S3, WL1, PL1 for the third cell read.

In the read sense plots of 810, 815, 820, and 825, a charging ramp waveform is illustrated as the bit line segment is precharged from an initial ground state level up to an approximate ½ $V_{DD}$ ($V_{CC}$) reference voltage which is produced by a dummy cell of the reference circuit. Two lines appear on the plots which reflect the two different responses to the sensing of a memory cell which is at a "0" state or a "1" state. When the local bitlines are coupled to the sense amplifier 710, and the sense amplifier is enabled and selected, a "0" state cell will produce the lower response, and a "1" state cell will produce the upper response shown.

Plot 830 shows the word line address input WL1 for selection of the target cell associated with this line, and which after the initial bitline precharge remains constant at a boosted voltage level (831) above $V_{DD}$ to minimize on-state resistance for maximum conduction of the FeCap charge to the local bitline 720 and to the sense amp 710. Plot 835 shows the plate line address input PL1 for selection of the target cell associated with this line, and which is at a $V_{DD}$ voltage level generally when the segment precharge is inactive.

Plot 840 illustrates the segment select 1 (766) input of FIG. 9 which makes the final memory cell address selection with the selection of the segment select switch S1 (712) and applies a boosted voltage level above $V_{DD}$ (similar to 831) to minimize on-state resistance for maximum conduction of the S1 transfer gate. The segment select 1 (766) input is generally active when a cell is to be sensed but also to provide segment precharging with the segment precharge select 1 (739).

Plot 845 illustrates the segment select 2 (767) input which makes the final memory cell address selection with the selection of the segment select switch S2 and applies a boosted voltage level above $V_{DD}$ (similar to 831) to minimize on-state resistance for maximum conduction of the S2 transfer gate. The segment select 2 (767) input is generally active when a cell is to be sensed but also to provide segment precharging with the segment precharge select 1 (739).

Plot 850 illustrates the segment select 3 (768) input which makes the final memory cell address selection with the selection of the segment select switch S3 and applies a boosted voltage level above $V_{DD}$ (similar to 831) to minimize on-state resistance for maximum conduction of the S3 transfer gate. The segment select 3 (768) input is generally active when a cell is to be sensed but also to provide segment precharging with the segment precharge select 1 (739).

Plot 855 illustrates the segment precharge select 1 (739) input which enables the gate of the segment precharge switch transistors 736 to couple the segment reference voltage from the segment reference 738 to all the segments of array 701. The precharge to this reference level may be used to preset the segment bit lines (e.g., 714, 722, and 724) to the same level as the other bit lines and sub I/O lines, and to preset data to the target memory cell at the same voltage as the plate line voltage to minimize D/C stress to the FeCaps. Thus, the segment reference voltage on the segment reference 738 should be the same as the plate line voltage during a "standby" time period. The segment precharge is done before and after the actual cell sensing.

Plot 860 illustrates the segment precharge select 2 input which enables the gate of the segment precharge switch transistors to couple the segment reference voltage from the segment reference to all the segments of array 702. The segment precharge is done before and after the actual cell sensing. However, array 702 of this example does not contain target cells, so the segment precharge select 2 input is left high (active) to keep the segments of array 702 at a precharged level, which is the same as the plate line voltage during standby.

Plot 865 illustrates the bit line precharge 794 input which enables the gate of the bit line precharge switch transistors 734 to conduct the ground voltage level as a precharge to the common bitlines (sub I/O lines), and any other I/O lines, or bitline segments which may be coupled to the sub I/O Lines. The bit line precharge is done before and after the sensing of each cell.

Figure 11A:
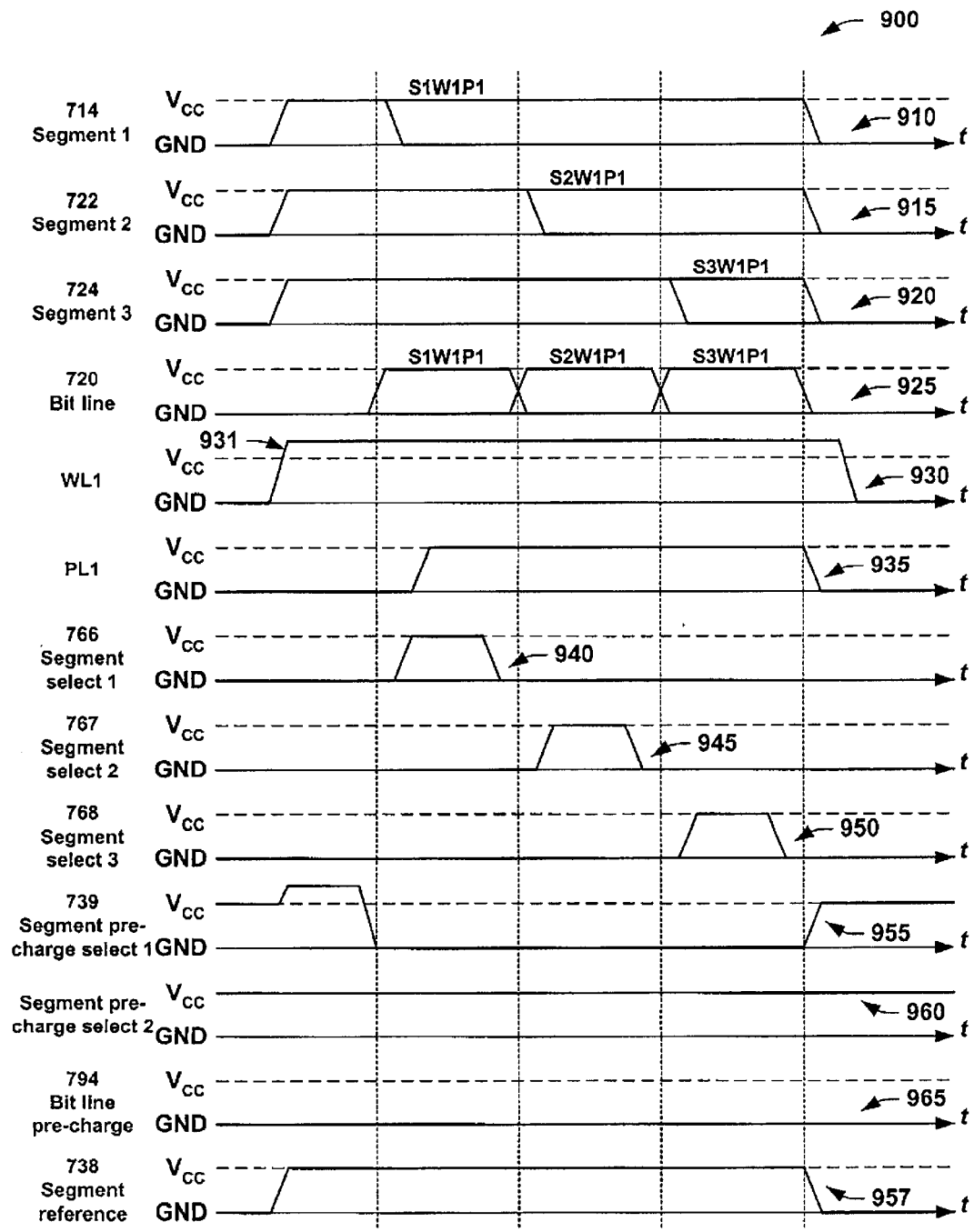
FIG. 11A is a timing diagram for the restore/write operation using a first method of the shared sense amp sensing scheme circuit of FIG. 9 for the 1T1C FeRAM array, wherein an exemplary memory cell from each of the three (3) segments of an array is written thereto, according to an aspect of the present invention.
Figure 11B:
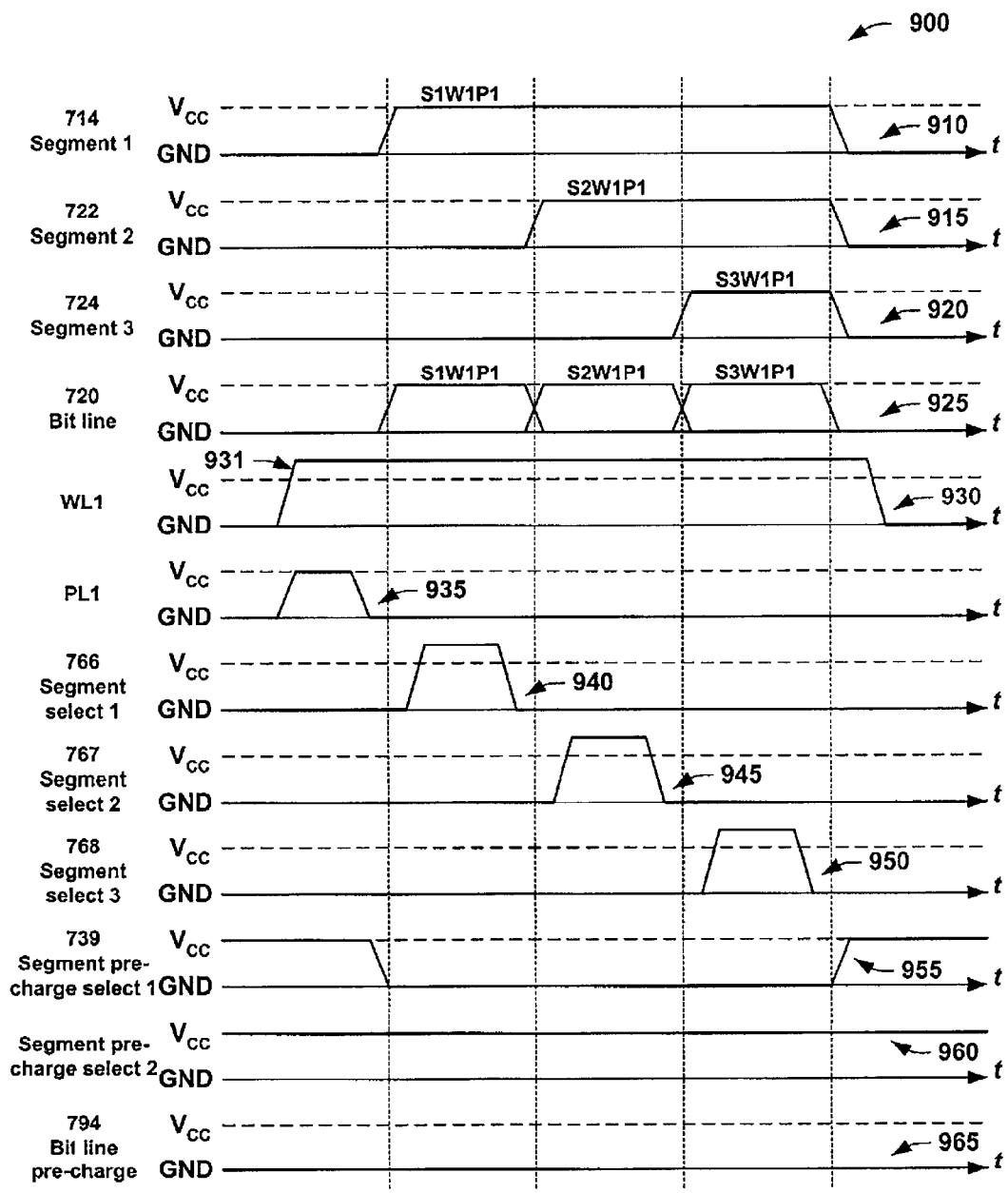
FIG. 11B is a timing diagram for the restore/write operation using a second method of the shared sense amp sensing scheme circuit of FIG. 9 for the 1T1C FeRAM array, wherein an exemplary memory cell from each of the three (3) segments of an array is written thereto, according to an aspect of the present invention.

FIGS. 11A and 11B is a timing diagram 900 for the restore or write operation and response of the shared sense amp scheme for the sample circuit of FIG. 9. In particular, the timing diagram 900 illustrates the restore/write operation timing of an exemplary 1T1C FeRAM memory cell from each of 3 segments of array 701, according to an aspect of the present invention. For simplicity, WL1 and PL1 address lines will be used for writing into a memory cell within each of the three segments, along with the specific segment select, but it should be appreciated that any WL and PL pair associated with the target cell could be used.

There are two types of restore/write methods wherein "internal" is used to specify the cell node (e.g., 714, 722, 724 of FIG. 9). The sense amp 710 is not directly related to the cell node, as the memory cell to bit line connection varies for each array. In the first of the two restore/write methods, internal "high" data ("1" state) is written to each cell, and then only the "low" data ("0" state) memory cells are discharged as illustrated in the timing diagram of FIG. 11A and flow chart of FIG. 19A. In the second of the two restore/write methods, internal "low" data ("0" state) is written to each cell, and then only the "high" data ("1" state) memory cells are charged as illustrated in the timing diagram of FIG. 11B and flow chart of FIG. 19B.

The following discussion will generally apply to FIG. 11A and the internal "high" data write and "low" data discharge, but will also generally apply to FIG. 11B and the internal "low" data write and "high" data charge, with some of the exceptions noted.

For example, plot 910 illustrates the restore/write operation response as seen at the segment 1 BL node 714 for the memory cell addressed at S1 (segment 1), WL1, and PL1, or "S1W1P1". Plot 915 illustrates the restore/write operation response as seen at the segment 2 BL node 722 for the memory cell addressed at S2 (segment 2), WL1, and PL1, or "S2W1P1". Plot 920 illustrates the restore/write operation response as seen at the segment 3 BL node 724 for the memory cell addressed at S3 (segment 3), WL1, and PL1, or "S3W1P1". Plot 925 illustrates the restore/write operation response as seen at the local bit lines 720 for all three memory cells as they are addressed in sequence at S1, WL1, PL1 for the first cell read, S2, WL1, PL1 for the second cell read, and S3, WL1, PL1 for the third cell read.

The "write" operation and the "restore" operation following a read, are generally interchangeable. According to an aspect of the present invention, and as shown by FIG. 11A and the first of the two restore/write methods, the write and restore operations write "high" data ("1" state) to each cell of the active plate and word lines, and then discharge only the "low" data ("0" state) memory cells. This sequential high and low data restore/write operation allows a common plate line connection in the present invention.

In the restore/write operation plots of 910, 915, 920, and 925, a waveform is illustrated which transitions to a "1" state as the bit line segment is precharged from an initial ground state level up to approximately $V_{DD}$ ($V_{CC}$). This reflects the response to the writing of a memory cell to a "1" state. Then, as discussed above, any memory cells which are to be restored or written to a "0" state, are discharged to ground.

Plot 930 shows the word line address input WL1 for selection of the target cell associated with this line, and which after the initial segment precharge remains constant at a boosted voltage level (931) above $V_{DD}$ to minimize on-state resistance for maximum conduction of the charge from the local bitline 720 into the FeCap of the target memory cell. Plot 935 shows the plate line address input PL1 for selection and precharging to the "1" state, all memory cells addressed by the WL's and the PL's associated with the target cell (e.g., WL1 and PL1). In FIG. 11B, PL1 is at a $V_{DD}$ voltage level only when the segment precharge and the word line are both active during the write/restore operation.

Plot 940 illustrates the segment select 1 (766) input of FIG. 9 which makes the final memory cell address selection with the selection of the segment select switch S1 (712) and in the method of FIG. 11B applies a boosted voltage level above $V_{DD}$ (similar to 931) to minimize on-state resistance for maximum conduction of the S1 transfer gate. During the write/restore operation of the method of FIG. 11A, for example, segment select 1 (766) input is generally active only when a cell is to be selected for discharge to the "0" state.

Plot 945 illustrates the segment select 2 (767) input which makes the final memory cell address selection with the selection of the segment select switch S2 and in the method of FIG. 11B applies a boosted voltage level above $V_{DD}$ (similar to 931) to minimize on-state resistance for maximum conduction of the S2 transfer gate. During the write/restore operation of the method of FIG. 11A, for example, segment select 2 (767) input is generally active only when a cell is to be selected for discharge to the "0" state.

Plot 950 illustrates the segment select 3 (768) input which makes the final memory cell address selection with the selection of the segment select switch S3 and in the method of FIG. 11B applies a boosted voltage level above $V_{DD}$ (similar to 931) to minimize on-state resistance for maximum conduction of the S3 transfer gate. During the write/restore operation of the method of FIG. 11A, for example, segment select 3 (768) input is generally active only when a cell is to be selected for discharge to the "0" state.

Plot 955 illustrates the segment precharge select 1 (739) input which enables the gate of the segment precharge switch transistors 736 to couple the segment reference voltage from the segment reference 738 to all the segments of array 701. The precharge to this reference level may be used to preset the segment bit lines (e.g., 714, 722, and 724) to 0 Volts before a restore operation, and to keep the segment bit lines (e.g., 714, 722, and 724) at the same voltage as the plate line voltage to minimize D/C stress to the FeCaps during the write/restore operation. Thus, the segment reference voltage on the segment reference 738 as illustrated by plot 957 of FIG. 11A, should be the same as the plate line voltage during a "standby" time period. The segment precharge is done before and after the actual write/restore operation.

Plot 960 illustrates the segment precharge select 2 input which enables the gate of the segment precharge switch transistors to couple the segment reference voltage from the segment reference to all the segments of array 702. The segment precharge is done before and after the actual write/restore operation. However, array 702 of this example does not contain target cells, so the segment precharge select 2 input is left high (active) to keep the segments of array 702 at a precharged level, which is the same as the plate line voltage during standby.

Plot 965 illustrates the bit line precharge 794 input which enables the gate of the bit line precharge switch transistors 734 to couple the ground voltage level as a precharge to the common bitlines (sub I/O lines), and any other I/O lines, or bitline segments which may be coupled to the sub I/O Lines. The bit line precharge is done before and after the sensing of each cell. However, array 702 of this example does not contain target cells, so the bit line precharge 794 input is left low (disabled).

Figure 12:
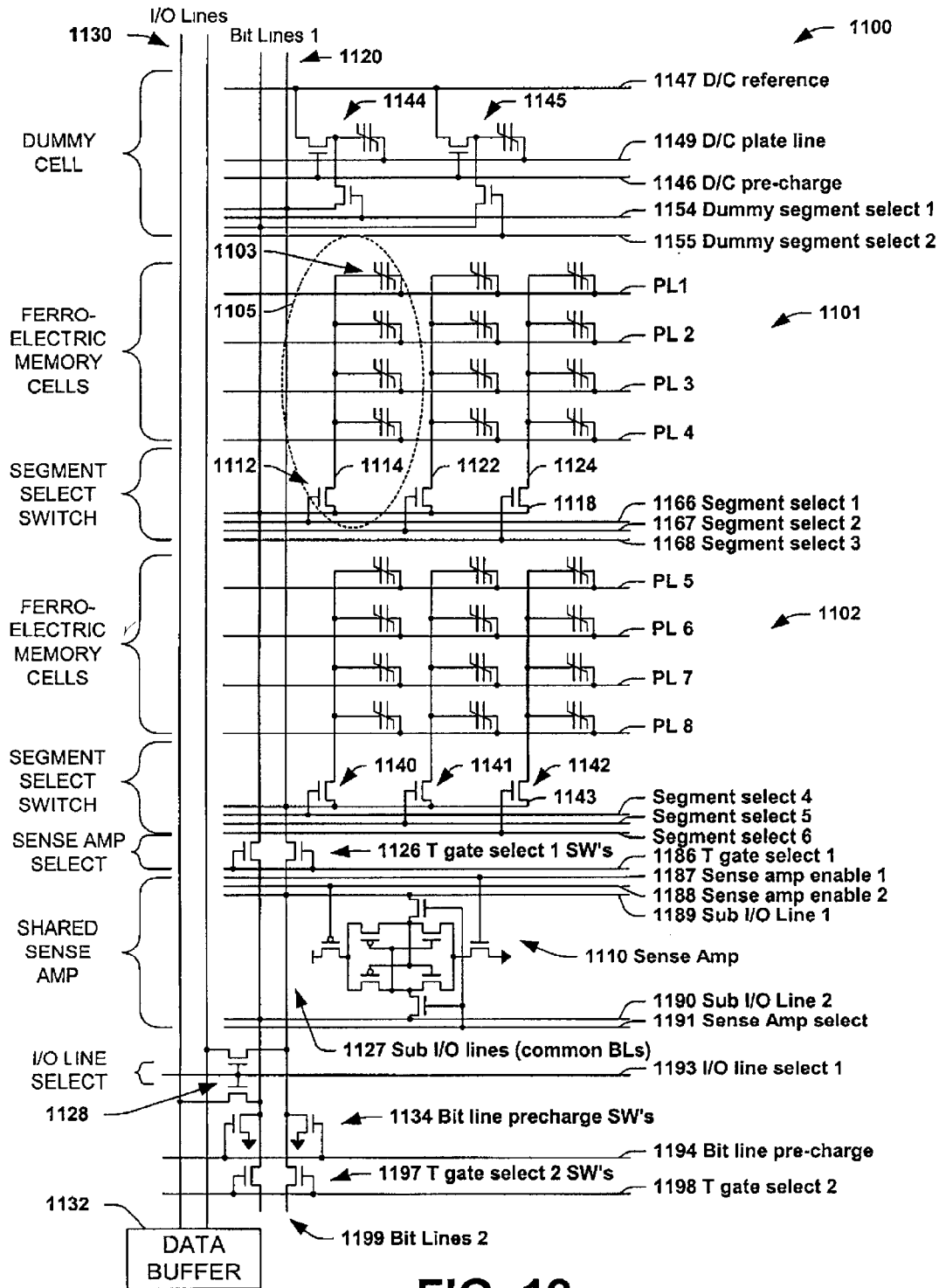
FIG. 12 is a schematic diagram illustrating an FeRAM array portion of an exemplary shared sense amp sensing scheme, wherein a sense amp, a data buffer, and dummy cells are shared among array segments and among arrays in a 1C FeRAM memory cell structure as shown in FIG. 8B (except without the word lines), according to another aspect of the present invention.

FIG. 12 is a schematic diagram of another exemplary circuit 1110 for the FeRAM array of the shared sense amp sensing scheme of FIG. 8B. Sample circuit 1100 comprises 2 arrays of 3 segments each. A first array 1101 has segments 1, 2, 3, and a second array 1102 has segments 4, 5, 6. Both arrays share a sense amp, a data buffer, and dummy cells among the 2 arrays and the 6 array segments of the 1C FeRAM memory cell structure as shown in FIG. 8B (except without the word lines as no access transistor is used in the 1C "capacitor only" memory structure), according to another aspect of the present invention. The use of the 1C FeRAM memory array and the beneficial array segmentation aspects of the present invention, make possible a small size FeRAM memory.

A target memory cell 1103 is selected within a target array segment 1105 to be sensed by a sense amplifier 1110 to determine the logic state of the cell 1103. First array 1101 segment 1105 is selected by segment select switch 1112 (S1 compares to 618 of FIG. 8B) coupling the (e.g., 4, 8, 16) memory cells of segment 1105 on segment bitline node S1 (1114) to a segment common node 1118 which is connected to one of the array local bitlines 1 (1120). Similarly, memory cells of a second segment on segment bitline node S2 (1122) are coupled to the segment common node 1118 and one of the array local bitlines 1 (1120). Finally, memory cells of a third segment on segment bitline node S3 (1124) are coupled to the segment common node 1118 and one of the array local bitlines 1 (1120). Segment select switches S1, S2, and S3 are NMOS transfer gate switches in the exemplary sample circuit, using a boosted gate voltage. A CMOS transfer gate may also be used if the added size is not a great issue.

Although sample circuit 1100 describes 2 arrays comprising 3 segments each, these segments could also be described as 6 segments of 1 array which are associated with the array local bitlines 1 (1120). In addition, T-gate select 1 switches 1126 couple the array local bitlines 1 (1120) to the sense amp 1110, which is shared with all the cells and bitline segments of the 6 array segments via the common bitlines "sub I/O Lines" 1127. Sub I/O Lines 1127 also provide common bitlines for coupling via DB/sub I/O select switches 1128 to I/O lines 1130 which are the inputs and outputs of a shared data buffer 1132.

Bitline precharge switches 1134 initially short to ground to provide a 0 Volt precharge on the common sub I/O Lines 1127.

In the same way, the second array 1102 comprising segments 4, 5, and 6 are selected via segment select switches S4 (1140), S5 (1141), and S6 (1142), respectively. Thus memory cell data on bitline nodes the associated with these segment select switches may be coupled and transferred to a segment common node 1143 which is connected to one of the array local bitlines 1 (1120).

A reference circuit comprising two dummy cells 1144 and 1145, places a reference voltage on one of the array local bitlines 1 (1120) for use by the shared sense amp. A high on dummy cell precharge (1146) switches a transistor within each of the dummy cells, coupling a reference voltage on dummy cell reference 1147 to charge a capacitor within each of the dummy cells. These dummy cell capacitors may, for example, be an FeRAM, MOS-C, or a metal-to-metal type capacitor. Each of these types has their advantages and disadvantages.

The plates of the dummy cells are addressed by dummy cell plate line 1149. Dummy cell 1144 is selected and coupled to one (e.g., the BL) of the array local bitlines 1 (1120) by dummy segment select 1 (1154), while dummy cell 1145 is selected and coupled to another (e.g., the BL) of the array local bitlines 1 (1120) by dummy segment select 2 (1155).

1C FeRAM Memory cell 1103 comprises an access transistor and an FeCap. The plate of memory cell 1103 of segment 1 is selected by a high on plate line 1 (PL1) to the plate of the FeCap. As shown by FIG. 12, when PL1 receives a high input, all 3 memory cells (viewing horizontally) attached thereto will present their respective data to the associated segment bitline nodes S1 (1114), S2 (1122), and S3 (1124). However, only the selected segment (via a selected segment select switch) will be coupled to the segment common node 1118 to transfer data to one of the array local bitlines 1 (1120).

Thus a target memory cell has a unique plate line, and segment select switch for addressing and accessing data of the target cell. Other memory cells of array 1101 with segments 1, 2, and 3, and array 1102 with segments 4, 5, and 6 are selected in the same way, by selecting a plate line, and a segment associated with the target memory cell.

To select each of the segments of the arrays 1101 and 1102, segment select lines are enabled to the segment select switches. For example, a high is applied to segment select 1 (1166) to cause the transfer gate for segment select switch S1 (1112) to conduct and couple data from any of the memory cells in segment one to the segment common node 1118 to one of the array local bitlines 1 (1120). Similarly, segment select 2 (1167) selects segment 2, and segment select 3 (1168) selects segment 3.

Array 1102 operates in the same way as array 1101, for selecting segments 4, 5 and 6, for precharging the segments and for addressing the memory cells, therefore needs no further explanation in these areas.

T-gate select 1 (1186) enables T-gate select 1 switches 1126 to couple the local bitlines segment 1120 to the sub I/O Lines 1127 common BL segment to share the sense amp 1110. Sense amp enable 1 (1187) and sense amp enable 2 (1188) enable and couple the $V_{CC}$ and ground power respectively, to the sense amp 1110. Sub I/O line 1 (1189) is common with one of the sub I/O Lines and the line 1 input of the sense amp 1110, while Sub I/O line 2 (1190) is common with the other of the sub I/O Lines and the line 2 input of the sense amp 1110. Sense amp select 1191 enables the sense amp to begin functioning as a differential amplifier, sensing the signals present on the common sub I/O Lines 1127.

When data has been sensed by the sense amplifier 1110, and is ready to be stored in the data buffer 1132, DB/sub I/O select switches 1128 are enabled with I/O line select 1 (1193) thereby coupling the sub I/O lines 1127 to the I/O lines 1130 which are the combination inputs and outputs of the data buffer 1132 for the transfer and sharing of data with the sense amp 1110.

Common and local bitlines of the arrays associated with the shared sense amp 1110 and data buffer 1132 are precharged to ground when the gates of the bitline precharge switches 1134 receive a high input from bitline precharge 1194.

Additional arrays (not shown) may share the sense amp and data buffer of FIG. 12, by selecting another set of T-gate select 2 switches 1197 via a T-gate select 2 (1198) gate input, which couples the sub I/O lines 1127 to another pair of local bitlines 2 (1199). Local bitlines 2 (1199) may also have, for example, 2 more arrays as illustrated by arrays 1101 and 1102.

An exemplary operation of the sample circuit of FIG. 12, for the 1C FeRAM array of the shared sense amp sensing scheme of FIG. 8B, will be described through the read and write/restore operations which follow.

Figure 13:
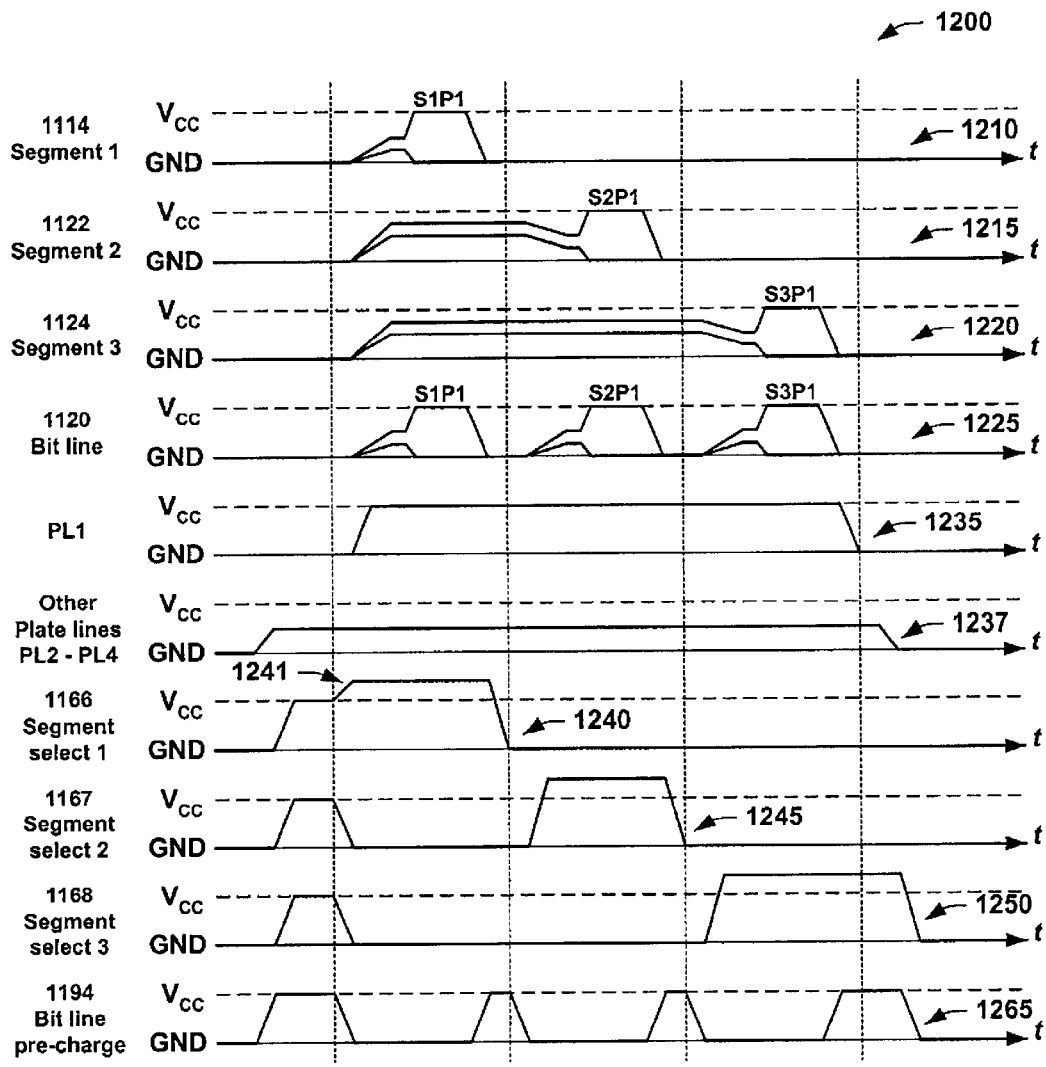
FIG. 13 is a timing diagram for the read operation of the shared sense amp sensing scheme circuit of FIG. 12 for the 1C FeRAM array, wherein an exemplary memory cell from each of the three (3) segments of an array is read sensed, according to an aspect of the present invention.

FIG. 13 is a timing diagram 1200 for the read operation of the shared sense amp sensing scheme for the sample circuit of FIG. 12. In particular the timing diagram 1200, illustrates the read operation of an exemplary 1C FeRAM memory cell from each of 3 segments of array 1101, according to an aspect of the present invention. For simplicity, address line PL1 will be used for sensing a memory cell within each of the three segments, along with the specific segment select, but it should be appreciated that any PL line associated with the target cell could be used.

For example, plot 1210 illustrates the read sense response as seen at the segment 1 BL node 1114 for the memory cell addressed at S1 (segment 1), PL1, or "S1P1". Plot 1215 illustrates the read sense response as seen at the segment 2 BL node 1122 for the memory cell addressed at S2 (segment 2), PL1, or "S2P1". Plot 1220 illustrates the read sense response as seen at the segment 3 BL node 1124 for the memory cell addressed at S3 (segment 3), PL1, or "S3P1". Plot 1225 illustrates the read sense response as seen at the local bit lines 1120 for all three memory cells as they are addressed in sequence at S1, PL1 for the first cell read, S2, PL1 for the second cell read, and S3, PL1 for the third cell read.

In the read sense plots of 1210, 1215, 1220, and 1225, a charging ramp waveform is illustrated as the bit line segment is precharged from an initial ground state level up to an approximate ½ $V_{DD}$ ($V_{CC}$) reference voltage which is produced by a dummy cell of the reference circuit. Two lines appear on the plots which reflect the two different responses to the sensing of a memory cell which is at a "0" state or a "1" state. When the local bitlines are coupled to the sense amplifier 1110, and the sense amplifier is enabled and selected, a "0" state cell will produce the lower response, and a "1" state cell will produce the upper response shown.

Plot 1235 shows the plate line address input PL1 for selection of the target cell associated with this line, and which is at a $V_{DD}$ voltage level generally when the segment precharge is inactive.

Plot 1237 illustrates a ½ $V_{DD}$ voltage applied to all the "other plate lines" inputs not associated with the target memory cell (e.g., PL2–PL4 in the example). During the entire read operation, the "other plate lines" are biased to the ½ $V_{DD}$ voltage level to minimize disturbances from the accessed target memory cell.

Plot 1240 illustrates the segment select 1 (1166) input of FIG. 12 which makes the final memory cell address selection with the selection of the segment select switch S1 (1112) and applies a boosted voltage level (1241) above $V_{DD}$ to minimize on-state resistance for maximum conduction of the S1 transfer gate. Segment select 1 (1166) input is generally active at $V_{DD}$ during an initial segment precharging, and when a cell is to be sensed applies a boosted voltage level above $V_{DD}$.

Plot 1245 illustrates the segment select 2 (1167) input which makes the final memory cell address selection with the selection of the segment select switch S2 and applies a boosted voltage level above $V_{DD}$ (similar to 1241) to minimize on-state resistance for maximum conduction of the S2 transfer gate. Segment select 2 (1167) input is generally active at $V_{DD}$ during an initial segment precharging, and when a cell is to be sensed applies a boosted voltage level above $V_{DD}$.

Plot 1250 illustrates the segment select 3 (1168) input which makes the final memory cell address selection with the selection of the segment select switch S3 and applies a boosted voltage level above $V_{DD}$ (similar to 1241) to minimize on-state resistance for maximum conduction of the S3 transfer gate. Segment select 3 (1168) input is generally active at $V_{DD}$ during an initial segment precharging, and when a cell is to be sensed applies a boosted voltage level above $V_{DD}$.

Plot 1265 illustrates the bit line precharge 1194 input which enables the gate of the bit line precharge switch transistors 1134 to conduct the ground voltage level as a precharge to the segments and the common bitlines (sub I/O lines), and any other I/O lines, or bitline segments which may be coupled to the sub I/O Lines. The bit line precharge is done before and after the sensing of each cell.

The initial segment precharge to the ground voltage level by the bit line precharge 1194 may also be used to preset the segment bit lines (e.g., 1114, 1122, and 1124) to the same level as the other bit lines and sub I/O lines, and to preset data to the target memory cell at the same voltage as the plate line voltage to minimize D/C stress to the FeCaps. Thus, the segment precharge voltage should be the same as the plate line voltage during a "standby" time period. The segment precharge is done before and after the actual cell sensing.

Figure 14:
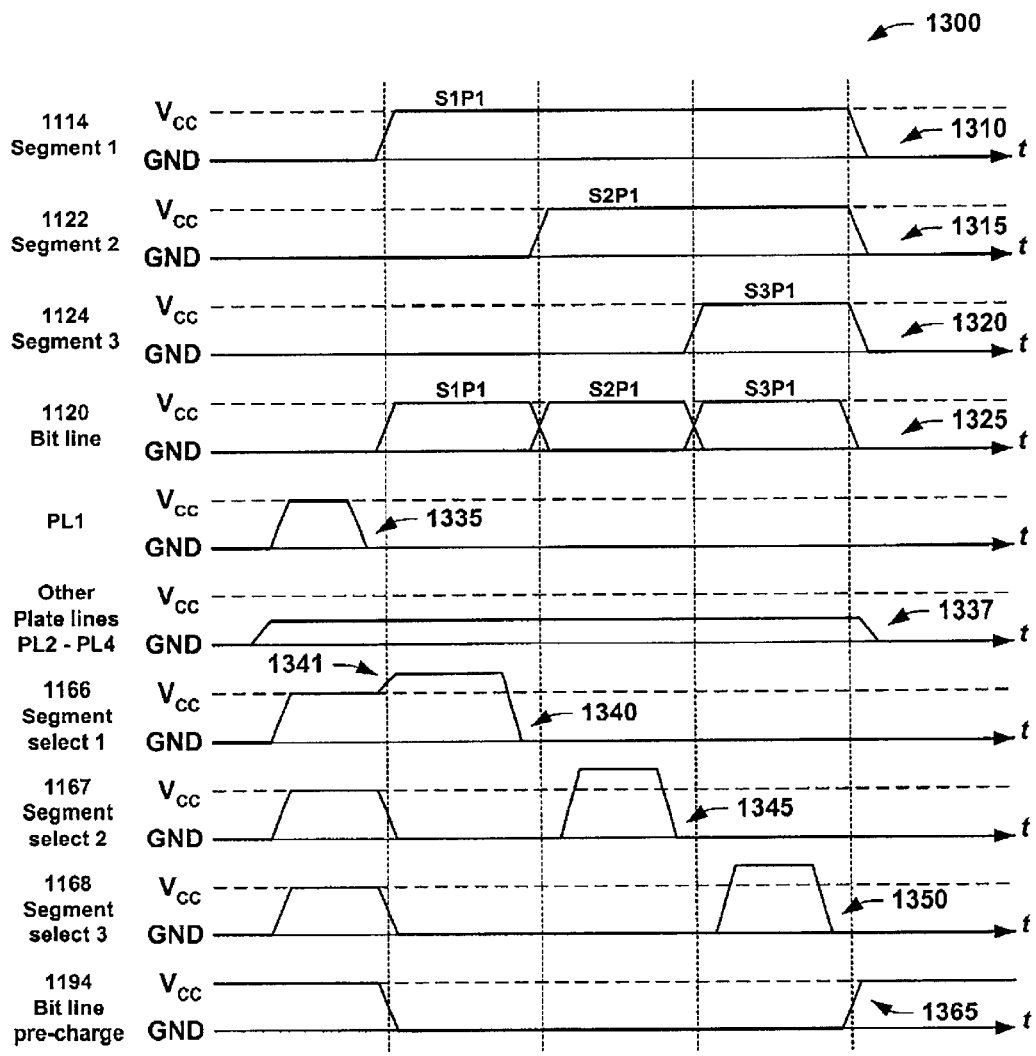
FIG. 14 is a timing diagram for the write operation of the shared sense amp sensing scheme circuit of FIG. 12 for the 1C FeRAM array, wherein an exemplary memory cell from each of the three (3) segments of an array is written thereto, according to an aspect of the present invention.

FIG. 14 is a timing diagram 1300 for the write operation and response of the shared sense amp scheme for the sample circuit of FIG. 12. In particular the timing diagram 1300, illustrates the write operation timing of an exemplary 1C FeRAM memory cell from each of 3 segments of array 1101, according to an aspect of the present invention. For simplicity, PL1 address lines will be used for writing into a memory cell within each of the three segments, along with the specific segment select, but it should be appreciated that any PL line associated with the target cell could be used.

For example, plot 1310 illustrates the write operation response as seen at the segment 1 BL node 1114 for the memory cell addressed at S1 (segment 1), PL1, or "S1P1".

Plot 1315 illustrates the write operation response as seen at the segment 2 BL node 1122 for the memory cell addressed at S2 (segment 2), PL1, or "S2P1". Plot 1320 illustrates the write operation response as seen at the segment 3 BL node 1124 for the memory cell addressed at S3 (segment 3), PL1, or "S3P1". Plot 1325 illustrates the write operation response as seen at the local bit lines 1120 for all three memory cells as they are addressed in sequence at S1, PL1 for the first cell read, S2, PL1 for the second cell read, and S3, PL1 for the third cell read.

The write operation and the "restore" operation following a read, are generally interchangeable. According to an aspect of the present invention, the write and restore operations write "low" data ("0" state) to each cell of the active plate and word lines, and then charge only the "high" data ("1" state) memory cells.

In the write operation plots of 1310,1315,1320, and 1325, is illustrated a waveform which presets a "0" state as the bit line segment is precharged to the ground state. A "0" state is stored in the ferroelectric capacitor by applying a $V_{DD}$ ($V_{CC}$) pulse to PL1. This waveform reflects the response to the writing of a memory cell to a "0" state. Then, as discussed above, any memory cells which are to be restored or written to a "1" state, are charged to Vdd(Vcc).

Plot 1335 shows the plate line address input PL1 for selection and precharging to the "0" state, all memory cells addressed by the PL's associated with the target cell (e.g., PL1). PL1 is at a $V_{DD}$ voltage level only during the initial segment precharge of the write/restore operation.

Plot 1337 illustrates a ½ $V_{DD}$ voltage applied to all the "other plate lines" inputs not associated with the target memory cell (e.g., PL2–PL4 in the example). During the entire write/restore operation, the "other plate lines" are biased to the ½ $V_{DD}$ voltage level to minimize disturbances from the accessed target memory cell.

Plot 1340 illustrates the segment select 1 (1166) input of FIG. 12 which makes the final memory cell address selection with the selection of the segment select switch S1 (1112) and applies a boosted voltage level (1341) above $V_{DD}$ to minimize on-state resistance for maximum conduction of the S1 transfer gate. Segment select 1 (1166) input is generally active at $V_{DD}$ during an initial segment precharging, and when a cell is to be charged to the "1" state applies the boosted voltage level above $V_{DD}$.

Plot 1345 illustrates the segment select 2 (1167) input which makes the final memory cell address selection with the selection of the segment select switch S2 and applies a boosted voltage level above $V_{DD}$ (similar 1341) to minimize on-state resistance for maximum conduction of the S2 transfer gate. Segment select 2 (1167) input is generally active at $V_{DD}$ during the initial segment precharging, and when a cell is to be charged to the "1" state applies the boosted voltage level above $V_{DD}$.

Plot 1350 illustrates the segment select 3 (1168) input which makes the final memory cell address selection with the selection of the segment select switch S3 and applies a boosted voltage level above $V_{DD}$ (similar to 1341) to minimize on-state resistance for maximum conduction of the S3 transfer gate. Segment select 3 (1168) input is generally active at $V_{DD}$ during the initial segment precharging, and when a cell is to be charged to the "1" state applies the boosted voltage level above $V_{DD}$.

Plot 1365 illustrates the bit line precharge 1194 input which enables the gate of the bit line precharge switch transistors 1134 to conduct the ground voltage level as a precharge to the segments and the common bitlines (sub I/O lines), and any other I/O lines, or bitline segments which may be coupled to the sub I/O Lines. The bit line precharge is done before and after the write/restore operation.

The initial segment precharge to the ground voltage level by the bit line precharge 1194 may also be used to preset the segment bit lines (e.g., 1114, 1122, and 1124) to the same level as the other bit lines and sub I/O lines, and to preset data to the target memory cell at the same voltage as the plate line voltage to minimize D/C stress to the FeCaps. Thus, the segment precharge voltage should be the same as the plate line voltage during standby. The segment precharge is done before and after the actual cell sensing.

In operation of the exemplary sample circuit 1100 of FIG. 12, for the 1C FeRAM array of the shared sense amp sensing scheme of FIG. 8B, a particular memory cell is selected, for example target memory cell 1103 of segment BL node S1 (1114) of array segment S1 (1105) of array 1101 associated with bitline 1 (1120), and sense amp 1110.

For example, the non-target plate lines PL2–PL4 of array 1101 are precharged to ½$V_{DD}$ ($V_{CC}$) to minimize disturbances when the target memory cell 1103 is accessed. The target plate line PL1 associated with the target memory cell is selected and precharged to ground. All the bit line segments S1–S3 (1114, 1122, and 1124) of array 1101, Sub I/O lines 1127, local bitlines 1 (1120) are precharged to 0 Volts, in response to a high on bit line precharge 1194 and the bit line precharge SW's 1134 shorting to ground. The precharge is ended by a low on bit line precharge 1194, and the non-target segments (S2–S3) of array 1101 are disconnected by disabling segment select 2 (1167) and segment select 3 (1167).

For final selection of the target memory cell 1103, target segment select 1 S1 (1166) is left at a high level, while target plate line PL1 is also accessed with a high.

As sense amp 1110 will input a sense signal from the target memory cell via a BL of the local bitlines 1 (1120) (e.g., BL) associated the memory cell, the reference voltage is produced on the opposite or "other" BL of the local bitlines 1 (1120) (e.g., BL). To produce the reference voltage, the dummy cells 1144 and 1145 are precharged by the D/C reference 1147, while the local bitlines 1 (1120) are precharged to the "0" state. A dummy cell (e.g., 1144 as it is coupleable to the other of the BL associated with the target memory cell) is selected and coupled with the other BL of the local bitlines 1 (1120) associated the memory cell, thereby sharing charge with the precharged BL to produce the reference voltage.

With the target memory cell now coupled to one of the local bitlines 1 (1120), and the reference voltage coupled to the other of the local bitlines, the sense amp 1110 is enabled (1187 and 1188), and coupled to the sub I/O lines 1127. Thus, the memory cell is coupled via a segment BL node 1114 thru NMOS transfer gate 1112 to local bitlines 1 (1120), thru T-gate select 1 switch 1126 which is coupled to the common bitlines (sub I/O lines 1127), shared by a sense amp 1110 providing coupling of the target memory cell memory data into the sense amplifier. In response, the target memory cell sense voltage swings to one of a "1" or "0" states, depending on the state of the memory cell, while the reference voltage swings toward the opposite state on the BL and BL inputs correspondingly of the sense amp 1110. The sense amp compares the common BL inputs of sub I/O lines 1127, and a determination is made as to the "1" or "0" state of the target memory cell 1103.

A data buffer 1132 is also coupleable to the sense amplifier thru I/O lines 1130 via DB/I/O line select transistors 1128. Sense amp data is temporarily stored in the data buffer 1132 for reading the cell state externally, and also for restoring the data back to the memory cell after the destructive read operation. The read process of the present invention, is done in a sequential read or restore/write operation. That is, the read and the write operations are not done simultaneously, but are done in series, or sequentially. If memory cells have a common plate line, they must be accessed sequentially due to the destructive read operation. The capacitor only 1C FeRAM memory cell scheme generally requires separated plate lines during the data overwrite operation to avoid disturbance from other cells.

Thus the data buffer 1132 is coupleable to the sense amplifier thru I/O lines 1130, while a pair of dummy cells 1144, and 1145, are also coupleable to the sense amplifier 1110 via the local bitlines 1120 and the common bitlines of sub I/O lines 1127, to provide sharing of a sense amp, a data buffer, and dummy cells to multiple array segments and multiple arrays of an FeRAM memory.

Furthermore, another memory array (not shown) may be coupled via the T-gate select 2 switches 1197, to another set of local bitlines 2 (1199) for access and sharing of a sense amp, a data buffer, and dummy cells with a plurality of arrays, or a plurality of array segments of an FeRAM memory.

In contrast to other prior art 1T1C or 1C FeRAM memory devices, the circuits and methods of the present invention seek to reduce in certain instances, the number of dummy cells, data buffers, and sense amplifiers required for a given number of memory cells in an FeRAM array, in order to minimize the size of the array, while also reducing the bitline capacitance and minimizing the quantity of address/control lines.

Advantageously, various combinations of a shared sense amp sensing scheme utilizing segmentation of array bit lines, and/or a shared data buffer circuit utilizing segmentation of array word lines may provide for a 1T1C and 1C FeRAM memory, a more dense layout pitch size thru sharing of common memory circuits (e.g., sense amp, data buffer, reference circuit dummy cells), faster access times and reduced power consumption through reduced bitline capacitance and reducing the number of active cells coupled to local bit lines or word lines, reduced memory size thru the use of the open bit line scheme and common plate lines (when using word line segmentation).

Figure 15:
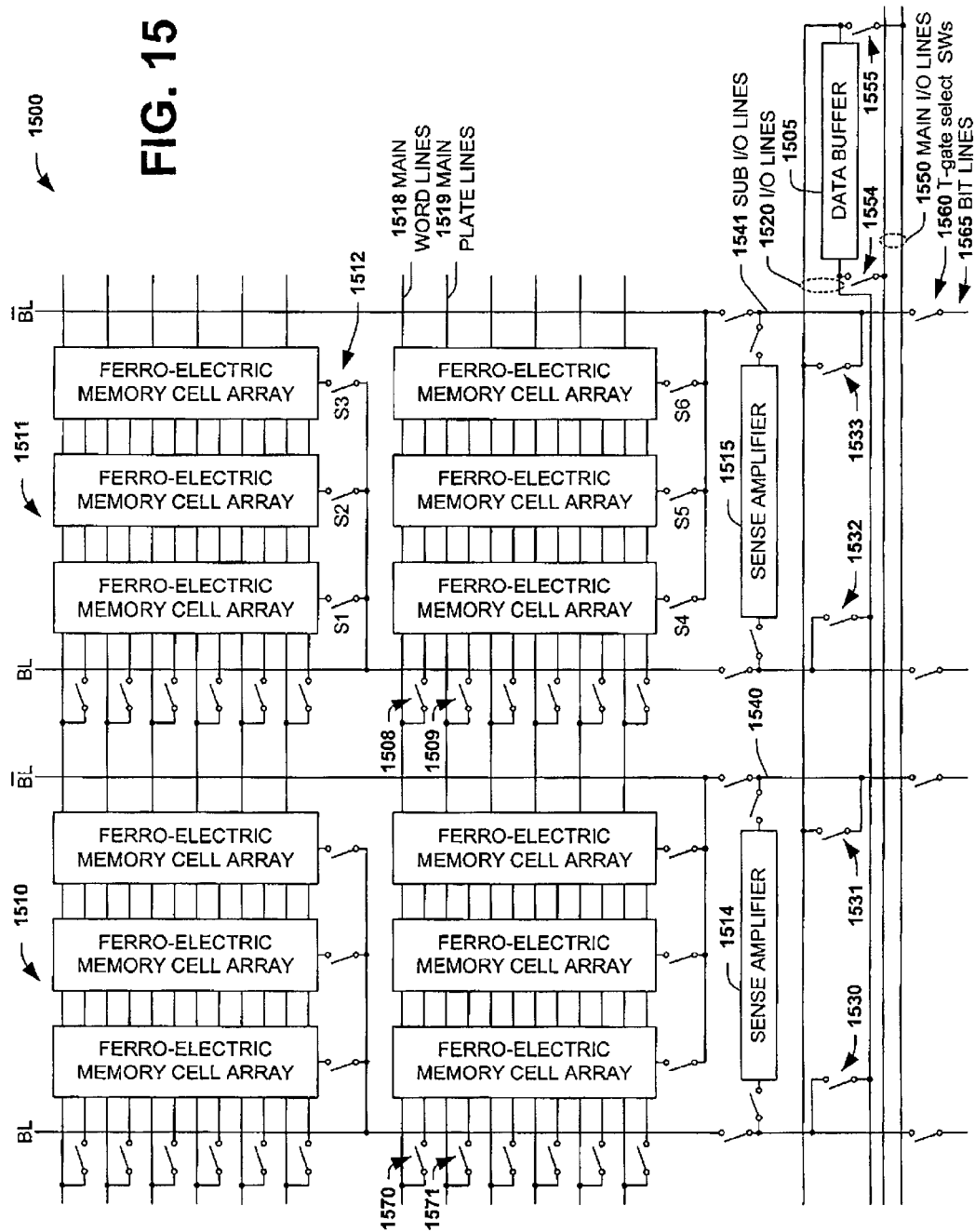
FIG. 15 is another block diagram of an exemplary shared sense amplifier concept of a ferroelectric memory device demonstrating a word line direction and bit line direction segmentation architecture using two arrays of memory cells of six (6) segments each, illustrating segment selection switches coupleable to both BL/BL bitlines of the associated array, sense amp and data buffer selectability and sharing to other array bitlines and to I/O lines, and illustrating how the data buffer may be shared among banks of sense amplifiers in which various aspects of the present invention may be carried out.

According to still another aspect of the present invention, a segmented word line architecture for the sharing of data buffers, along with the concept of segmented bit lines for sharing sense amplifiers, and dummy cells is illustrated in FIG. 15. Block diagram 1500 of FIG. 15 illustrates, in one example, two of the array sets or array "banks" of FIG. 8B, coupleable by word line direction segments 1508 and 1509, and sharing a single data buffer 1505. The two exemplary array banks 1510 and 1511, are each similar to FIG. 8B, wherein each array bank demonstrates bit line direction segmentation using two arrays of memory cells of 3 segments each 1512, using segment selection switches coupleable to both BL/BL bitlines of the associated array. Each array bank also demonstrates sense amp and data buffer selectability and sharing to other array bitlines and to I/O lines, and illustrates how the data buffer 1505 may be shared among the two array banks with sense amplifiers (1514, or 1515) and memory cells.

Depending on the array type, word line direction segmentation may further need to be subdivided into word line segments 1508 and plate line segments 1509 for 1T1C array structures, while the 1C array structure may only require plate line segments 1509. Thus the word line direction segments 1508 and 1509 are operable to select a target segment containing the target memory cell, by applying a voltage to the gate of a word line segment select transistor at word line segments 1508 and to the gate of a plate line segment select transistor at plate line segments 1509, thereby coupling a target word line of the target segment to a corresponding main word line 1518, and a target plate line of the target segment to a corresponding main plate line 1519.

The data buffer 1505 is shared over a pair of I/O lines 1520, with the two array banks, and coupled into each bank by a set of I/O switch transistors 1530 and 1531 for bank 1510, and I/O switch transistors 1532 and 1533 for bank 1511. Sub I/O lines 1540 and 1541 are then coupleable to sense amps 1514 and 1515, respectively, for sharing the data buffer with the array banks 1510 and 1511, respectively. Further, the switching just described in FIG. 15 demonstrates that one sense amp, or dummy cell could also be shared between the two array banks 1510 and 1511, particularly if the bit line capacitance is balanced between BL and $\overline{BL}$ and small compared to the signal charge from the ferroelectric capacitor. The selection of the architecture, wherein bit lines or I/O lines are used to propagate memory cell signal charge may also depend upon the specific layout size, layout flexibility and sensing margin.

The data buffer may be read or written into externally via the main I/O lines 1550 when selected by main I/O switch transistors 1554 and 1555.

Other additional arrays (not shown) may also share the sense amps 1514, or 1515 and the data buffer 1505 by selecting T-gate select switches 1560 coupling to the additional arrays in the bitline direction via bitline segments 1565, or in the word line direction via word line segments 1570 and 1571.

Figure 16:
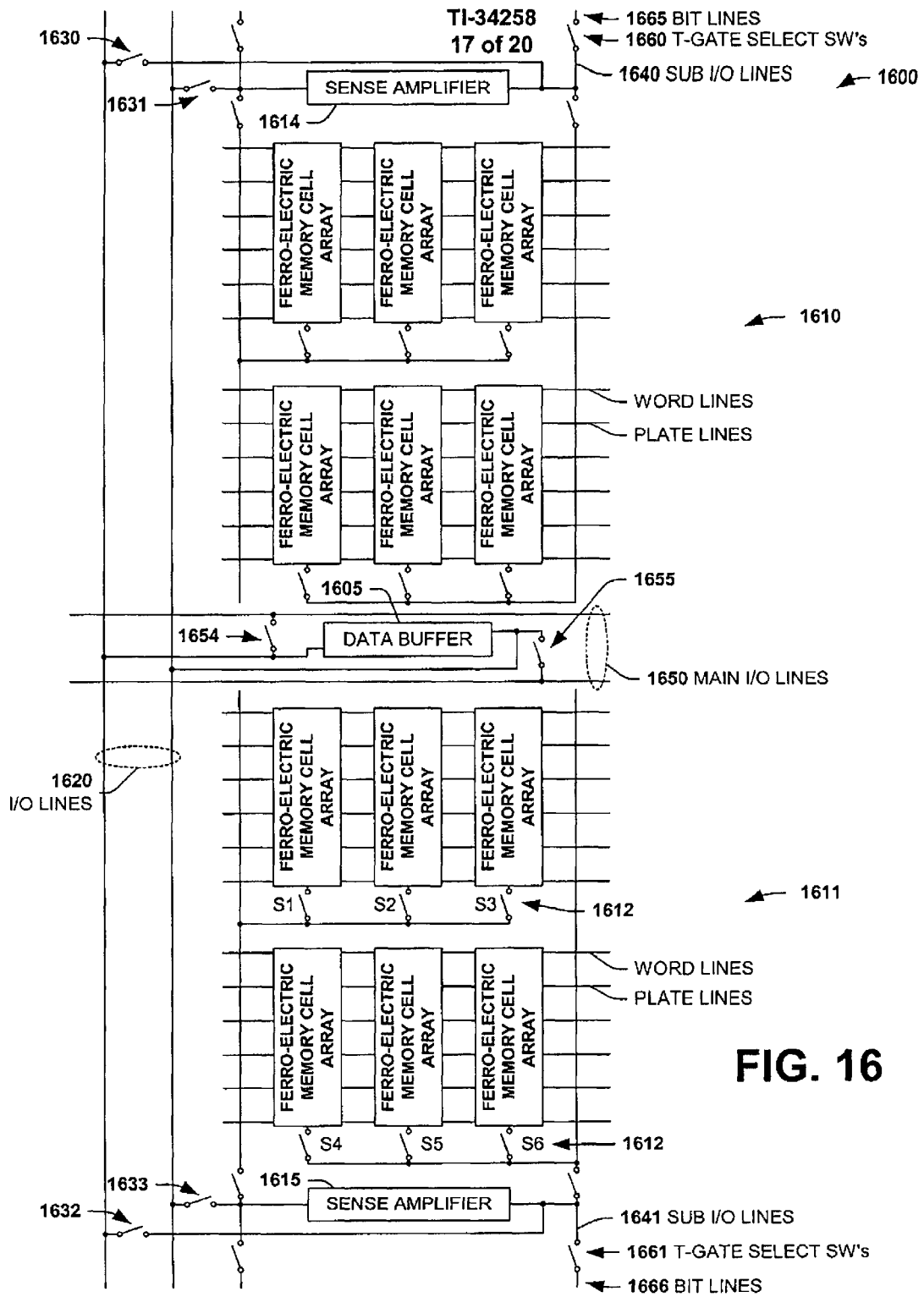
FIG. 16 is yet another block diagram of an exemplary ferroelectric memory device demonstrating another example of the bit line direction segmentation architecture using two arrays of memory cells of six (6) segments each, illustrating segment selection switches coupleable to both BL/BL bitlines of the associated array, sense amp and data buffer selectability and sharing to other array bitlines and to I/O lines in which various aspects of the present invention may be carried out.

The concept of segmentation in the bit line direction for the sharing of data buffers, and for sharing sense amplifiers, and dummy cells is illustrated in FIG. 16, in accordance with another aspect of the present invention. Block diagram 1600 of FIG. 16 illustrates two of the array sets or array "banks" of FIG. 8B, sharing a single data buffer 1605 among bit line direction shared sense amps. The two exemplary array banks 1610 and 1611, are each similar to FIG. 8B, wherein each array bank demonstrates bit line direction segmentation using two arrays of memory cells of 3 segments each, using segment selection switches 1612 coupleable to both BL/$\overline{BL}$ bitlines of the associated array. Each array bank also demonstrates sense amp and data buffer selectability and sharing to other array bitlines and to I/O lines, and illustrates how the data buffer 1605 may be shared between the two banks of sense amplifiers (1614, or 1615) and memory cells.

The data buffer 1605 is shared over a pair of I/O lines 1620, with the two array banks, and coupled into each bank by a set of DB/I/O select switches 1630 and 1631 for bank 1610, and DB/I/O select switches 1632 and 1633 for bank 1611. Sub I/O lines 1640 and 1641 are then coupleable to sense amps 1614 and 1615, respectively, for sharing the data buffer with the array banks 1610 and 1611, respectively. Further, the switching just described in FIG. 16 demonstrates that one sense amp, or dummy cell could also be shared between the two array banks 1610 and 1611.

The data buffer may be read or written into externally via the main I/O lines 1650 when selected by switches 1654 and 1655.

Other additional arrays (not shown) may also share the sense amps 1614, or 1615 and the data buffer 1605 by selecting T-gate select switches 1660, and 1661 coupling to the additional arrays in the bitline direction via bitline segments 1665, and 1666, respectively. Here again, segmen- tation for additional sharing may also be extended in the word line direction via word line segments and/or plate lines segments (not shown) 1670 and 1671.

Thus, according to another aspect of the present invention, a 1T1C and 1C FeRAM memory device provides for the read sensing of a target memory cell, and a system for sharing several specific memory circuits of an array of FeRAM memory cells. The memory device of the present invention includes an array of memory cells which has segmented bit lines and segmented word lines which are individually selectable, a segment decoder operable to receive segment address data and select a target segment associated with the target memory cell and couple the target segment to a local bitline and word line associated with the target segment, a cell decoder to receive target memory cell address data and select the target memory cell based on the address data, and operable to couple the target memory cell to the target segment associated with the target memory cell, for transfer of memory cell data into or out from the target memory cell, and a transfer circuit operable to sense, store and transfer the state of the target memory cell into or out of the target memory cell, wherein the segment decoder and the cell decoder cooperate to couple the transfer circuit with a target pair of bitlines associated with the target memory cell, whereby the transfer circuit is shared between the segments in the array.

By sharing several specific memory circuits, cooperatively in this way, the memory circuits are made "common" memory circuits. Greater use of shared or common memory circuits, in some instances, particularly with the use of open bit line architectures and the 1C FeRAM memory cell configuration, may lend themselves to overall reductions in memory device size, local bit line capacitances, and access times.

Another aspect of the present invention provides a methodology for 1C FeRAM memory device read cycle operation and sensing of a target memory cell of an array of FeRAM memory cells and the manufacture of such devices illustrated and described herein, as well as with other such devices.

Figure 17:
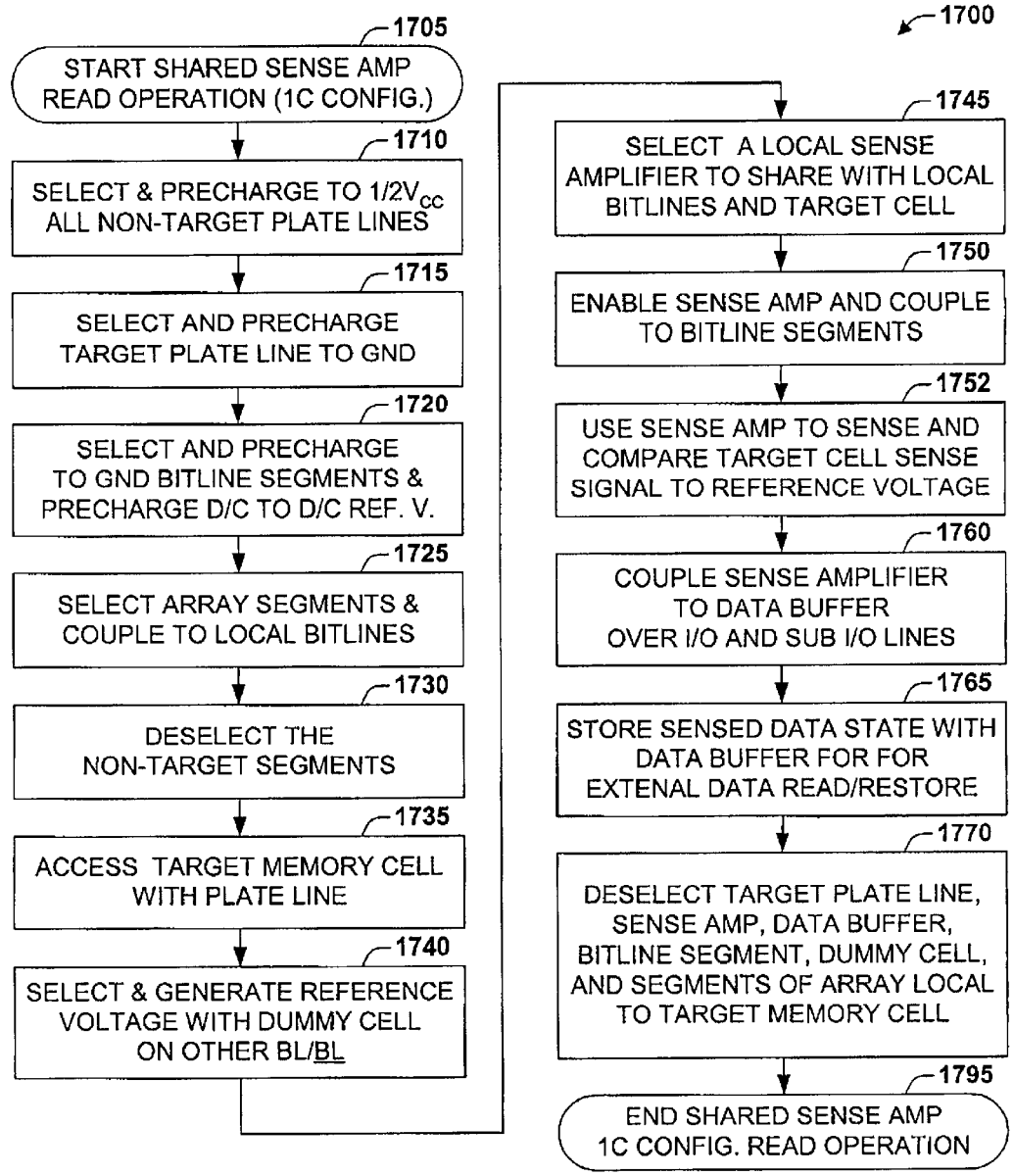
FIG. 17 is a flow diagram illustrating an exemplary method for the read operation of a memory cell of the 1C FeRAM array structure of FIG. 12 in association with an aspect of the present invention.

FIG. 17 is a flow diagram illustrating an exemplary method for the read operation of a memory cell of the 1C FeRAM array structure of FIG. 12 in association with an aspect of the present invention.

Referring now to FIG. 17, an exemplary method 1700 is illustrated for the read operation of a 1C memory cell of an FeRAM array using segmentation in the bit line direction to provide a shared sense amp, a data buffer, and dummy cells which are shared among array segments and arrays in association with an aspect of the present invention. While the exemplary method 1700 is illustrated and described herein as a series of acts or events, it will be appreciated that the present invention is not limited by the illustrated ordering of such acts or events, as some acts or events may occur in different orders and/or concurrently with other acts or events apart from that shown and described herein, in accordance with the invention. In addition, not all illustrated acts or events may be required to implement a methodology in accordance with the present invention. Moreover, it will be appreciated that the method 1700 may be implemented in association with the apparatus and systems illustrated and described herein as well as in association with other systems not illustrated.

The method 1700 comprises read cycle operation and sensing of a target memory cell of an array of FeRAM memory cells, wherein the 1C FeRAM memory device selects and accesses a target memory cell to be sensed and read for determining the logic state ("0" or "1") of the target memory cell. The memory device uses an array which is subdivided into smaller array segments which are individually selectable with segment select switches and is operable to select and couple a target segment with the target memory cell to a pair of local bitlines associated with the array. T-gate select switches couple the local bitlines to common bitlines of a pair of sub I/O lines which are operable to be coupled to a sense amp, and a data buffer, which may be shared with the array segments and other arrays. The sense amp receives a sense voltage from the target memory cell on one input of the sense amp, and a reference voltage produced by charge from a dummy cell to the other of the sub I/O line inputs to the sense amplifier. The logical state of the target memory cell is determined by the sense amp and temporarily stored in the data buffer for external reading of the logic state of the cell, and for restoring the state to the target memory cell.

By selecting and coupling array segments and bit line segments in this way, specific memory circuits may be shared with multiple array segments and a plurality of arrays. Note: in the example circuit of FIGS. 9 and 12, the shared sense amp and data buffer also have a bit line precharge circuit (e.g., 1134 of FIG. 12) which is shared on the sub I/O lines 1127, while the dummy cells may be shared on the local bitlines 1120.

Figure 18:
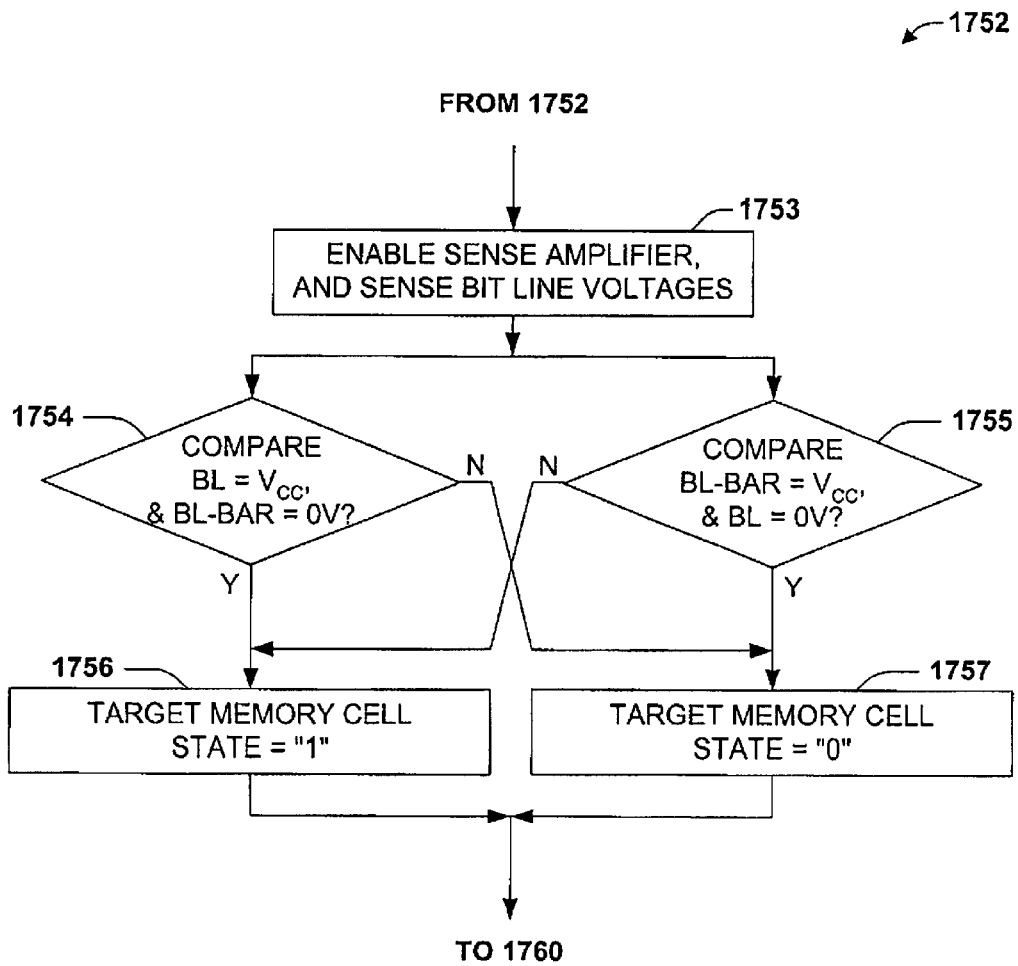
FIG. 18 is a flow diagram illustrating an exemplary method for the enable sense amp and compare to determine the target cell state operation of the read operation of FIG. 17 in association with an aspect of the present invention.

The shared sense amp sensing scheme read operation is illustrated in the method of FIGS. 17 and 18 according to the circuit of FIG. 12. The shared sense amp read operation method begins at 1705. In one exemplary implementation of this scheme, a particular memory cell is initially determined, for example a target memory cell 1103 which is associated with a local bit line 1120, and a sense amplifier 1110, and having a target plate line PL1 and a target array segment S1(1105). At 1710 all non-target plate lines PL2–PL4 associated with the target memory cell 1103 are selected and precharged to ½ $V_{DD}$, to avoid disturbances from memory cell access.

At 1715 target plate line PL1 is selected (e.g., by a cell decoder with address data) and precharged to ground (0 volt). The local bit lines are selected and coupled (e.g., by a segment decoder) at 1720, to the sub I/O lines with the conduction of the T-gate select 1 switches 1126, at the command of T-gate select 1 (1186), while the bitline precharge transistors 1134 are shorted to ground on command from the bit line precharge line 1194, and the dummy cells 1144 and 1145 are precharged to the reference voltage on D/C reference 1147 at the direction of D/C precharge 1146.

At 1725 the three array segments S1–S3 are selected and coupled to one of the local bitlines 1120 for precharging to 0V, with the conduction of segment select switches 1112, at the command of segment select 1 (1166), segment select 2 (1167), and segment select 3 (1168). At the end of this precharge period, the non-target segments S2, and S3 are deselected at 1730, leaving only segment select 1 (1166) still coupled. At 1735 the target memory cell 1103 is accessed with a high on the plate line PL1. At 1740, a reference voltage is generated on the other bitline of the local bit lines 1120 when dummy cell 1144 is accessed with a high on D/C plate line 1149 and couples its' charge to the other bitline of the local bit lines 1120 associated with the target memory cell 1103, with a high on dummy segment select 1 (1154).

At 1745 a local sense amplifier 1110 is selected to be shared with the array local bitlines 1120 and the target memory cell 1103. The local bitlines now have the target memory cell coupled to one BL of the local bitlines 1120, and the dummy cell reference voltage coupled to the other BL of the local bitlines 1120 associated with the target memory cell 1103.

At 1750 sense amp enable 1 (1187) and sense amp enable 2 (1188) enable and couple the $V_{DD}$ power and ground respectively, to the sense amp 1110. Sub I/O line 1 (1189) is common with one of the sub I/O Lines and the line 1 input of the sense amp 1110, while Sub I/O line 2 (1190) is common with the other of the sub I/O Lines and the line 2 input of the sense amp 1110. Sense amp select 1191 enables the sense amp to begin functioning as a differential amplifier, sensing the signals present on the common sub I/O Lines 1127.

The sense cycle begins at 1752 of FIG. 17 and is expanded on to FIG. 18. At this point, with the sense amplifier now coupled to the local bitlines, the sense amplifier has the reference voltage on one BL or BL sense amp input, and a sense signal from the target memory cell on the other of the BL or BL sense amp inputs. The sense amp is enabled at 1753 of FIG. 18, and responds to the inputs of the sense process by charging to opposite state levels depending on the "0" or "1" state of the target memory cell. For example, depending on the "1" or "0" state of the target memory cell, one sense amp input will charge toward $V_{DD}$ and the other sense amp input will charge toward 0V.

After an appropriate settling time, the sense amp differentially compares at 1754 and 1155, the two BL or BL sense amp inputs, to determine which input is greater. At 1754 a determination is made if the BL is now at $V_{CC}$ and the BL is at 0V. At 1755 a determination is made if the BL is now at $V_{CC}$ and the BL is at 0V. If a determination was made at 1754 that BL is now at $V_{CC}$ and the BL is at 0V, then the target memory cell is identified as having a "1" state at 1756. Otherwise, at 1757 the target memory cell is identified as having a "0" state, and the method continues to 1760 of FIG. 17. Further, If a determination was made at 1755 that BL is now at $V_{CC}$ and the BL is at 0V, then the target memory cell is identified as having a "0" state at 1757. Otherwise, at 1756 the target memory cell is identified as having a "1" state, and the method continues back to 1760 of the flow chart of FIG. 17 for the read operation of the circuit of FIG. 12.

When at 1760 the data state has been determined by the sense amplifier 1110, and is ready to be stored in the data buffer 1132, DB/sub I/O select switches 1128 are enabled with I/O line select 1 (1193). In this way, the sub I/O lines 1127, are coupled to the I/O lines 1130 which are the combination inputs and outputs of the data buffer 1132 for the transfer and sharing of data with the sense amp 1110. The data state determined by the sense amplifier 1110 is transferred at 1765, over the I/O lines 1130 to the data buffer 1132 for external data read from outside of the memory array and for the subsequent restore operation of the data state back to the target memory cell 1103.

Finally, at 1770 the target plate line PL1, the sense amp 1110, the data buffer 1132, all the bit line segments, the dummy cell 1144, and the segment S1 (1105) of the array 1101 associated with target memory cell 1103 are deselected and disconnected.

Thereafter the shared sense amp 1C FeRAM memory cell read operation ends at 1795, and the method 1700 may be repeated for subsequent read operations of a memory device using shared memory circuits.

Returning again to FIGS. 19A and 19B, the exemplary flow charts 1900A and 1900B illustrate a portion of the restore/write operations of the first and second methods of the circuit of FIG. 12, as previously discussed in association with FIG. 9. In the first of the two restore/write methods, internal "high" data ("1" state) is written to each cell, and then only the "low" data ("0" state) memory cells are discharged, as illustrated in the flow chart of FIG. 19A. In the second of the two restore/write methods, internal "low" data ("0" state) is written to each cell, and then only the "high" data ("1" state) memory cells are charged as illustrated in the flow chart of FIG. 19B.

Figure 19A:
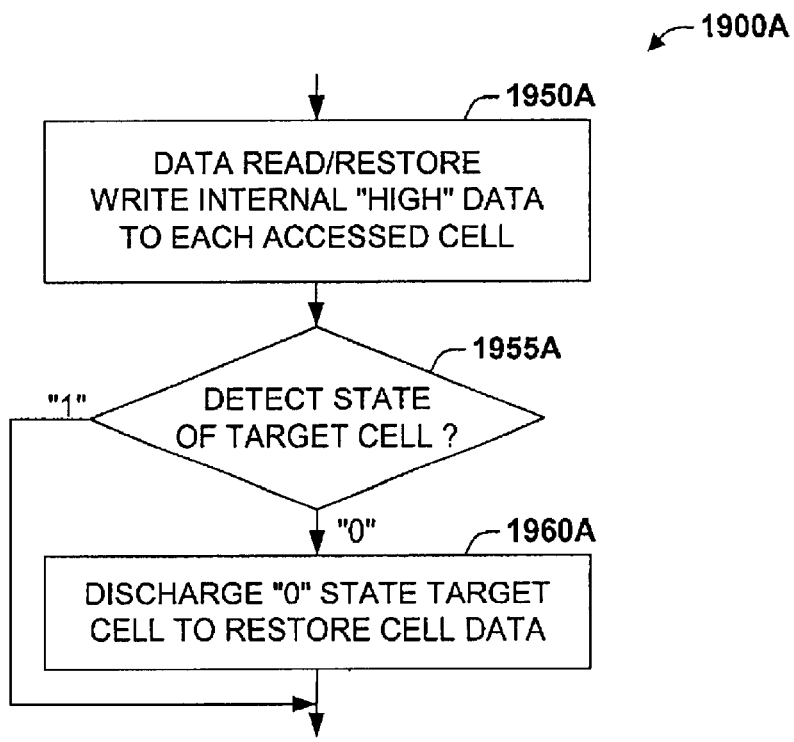
FIG. 19A is an exemplary flow chart illustrating a portion of the restore/write operations using a first method of the circuit of FIG. 12.

For example, in one particular portion of the restore/write operation the internal "high" data write and subsequent "low" data discharge method 1900A of FIG. 19A, takes place, wherein at 1950A the memory cells which were accessed by the read operation of a target memory cell are subsequently overwritten with "high" data "1" states. A determination is made at 1955A whether the detected state of the target memory cell (as stored in the temporarily in the data buffer) was a "1" or a "0" state. If the detected state of the target memory cell was determined to be a "0" state, then the target memory cell is discharged to a "0" state at 1960A, otherwise if the detected state of the target memory cell was determined to be a "1" state, then the target memory cell is left to remain at the "1" state, and the restore/write method 1900A continues.

Thus, the memory cells accessed by the read operation 1700 are subsequently overwritten in the restore/write operations 1900A with "high" data "1" states, then only the cells which were "low" data are discharged back to the "0" state.

Figure 19B:
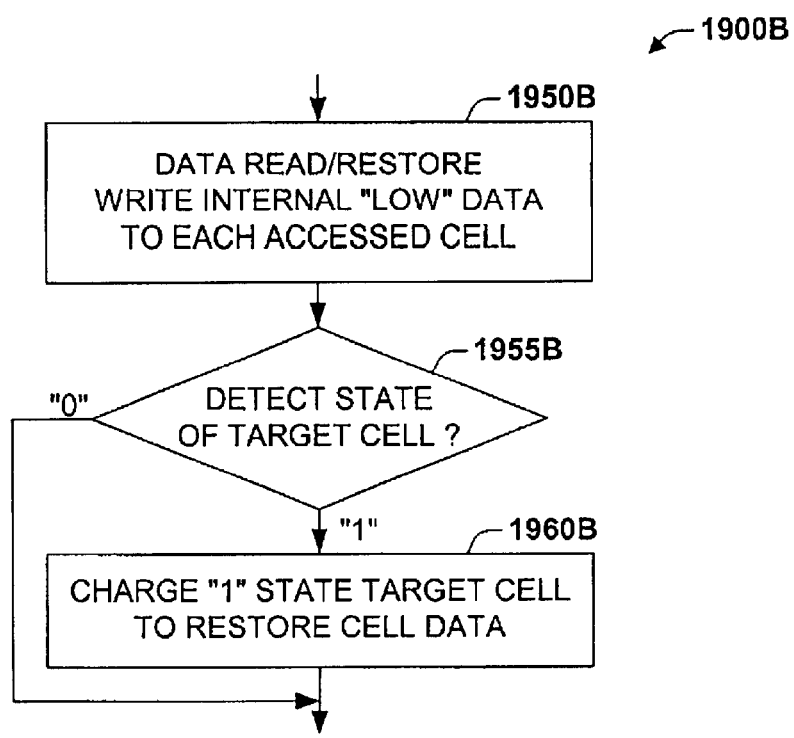
FIG. 19B is an exemplary flow chart illustrating a portion of the restore/write operations using a second method of the circuit of FIG. 12.

In the internal "low" data write and subsequent "high" data charge method 1900B of FIG. 19B, at 1950B the memory cells which were accessed by the read operation of a target memory cell are subsequently overwritten with "low" data "0" states. A determination is made at 1955B whether the detected state of the target memory cell (as stored in the temporarily in the data buffer) was a "1" or a "0" state. If the detected state of the target memory cell was determined to be a "1" state, then the target memory cell is charged to a "1" state at 1960B, otherwise if the detected state of the target memory cell was determined to be a "0" state, then the target memory cell is left to remain at the "0" state, and the restore/write method 1900B continues.

Thus, the memory cells accessed by the read operation 1700 are subsequently overwritten in the restore/write operations 1900B with "low" data "0" states, then only the cells which were "high" data are charged back to the "1" state.

The methodology 1700 thus provides for an FeRAM memory device to accurately read the state of a target memory cell of an array of 1C FeRAM memory cells which is capable of using a small number of sense amps, data buffers, and dummy cells for producing a small memory device, which is simple in design and control, and may in some instances reduce bit line capacitances and memory access times. The FeRAM memory structure of the present invention, comprises 2 arrays of 3 segments each. A first array has segments S1, S2, S3, and a second array has segments S4, S5, S6. Both arrays share a sense amp, a data buffer, and dummy cells among the 2 arrays and the 6 array segments of the 1C FeRAM memory, according to an aspect of the present invention. The use of the 1C FeRAM memory array and the beneficial array segmentation aspects of the present invention, make possible a small size FeRAM memory.

Accordingly, an FeRAM memory device is provided which provides the sharing of several memory circuits between arrays and segments of those arrays. Using bit line direction segmentation of the array or multiple arrays, a more compact memory device is provided.

Other variants of methodologies may be provided in accordance with the present invention, whereby a 1C FeRAM read cycle operation is accomplished employing bit line and word line direction segmentation and selective coupling to a plurality of arrays or segments of arrays.

According to an aspect of the present invention, the array is subdivided by segmenting the array in a bit line direction and a word line direction. The array segments are selected and coupled to a local BL/BL by segment select switches, while pairs of BL/BLs are segmented to couple between a plurality of arrays in the bitline direction with T-gate select switches providing a means of sharing a sense amplifier, a data buffer, and the dummy cells of a reference circuit between the plurality of arrays in the bit line direction. Word lines (where used) and plate lines are segmented between pluralities of arrays in the word line direction by word line and plate line select switches providing a means of sharing a data buffer among array banks of sense amplifiers. Thus, two-dimensional segmentation of the array allows more extensive sharing of the sense amplifiers, data buffers, and dummy cells among array segments and between arrays. More sharing permits a reduction in the number of these shared circuits, thereby facilitating the use of a denser cell array structure such as the 1T1C or the 1C cell arrangement, which provides for a smaller memory size.

Thus, the shared sense amp sensing scheme utilizing segmentation of array bit lines, and a shared data buffer circuit utilizing segmentation of array word lines may provide for a 1T1C and 1C FeRAM memory having a more dense layout pitch size thru sharing of common memory circuits (e.g., sense amp, data buffer, reference circuit dummy cells), faster access times and reduced power consumption through reduced bitline capacitance and reducing the number of active cells coupled to local bit lines or word lines, reduced memory size thru the use of the open bit line scheme and common plate lines (when using word line segmentation).

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A ferro-electric memory device, comprising:
   an array of FeRAM memory cells associated with a plurality of word lines and plate lines and a data buffer, wherein the array is further subdivided in a word line direction into segments which are individually selectable, and wherein each segment of the array is associated with the plurality of word lines and plate lines, a pair of bitlines and a sense amplifier, and wherein each segment comprises a plurality of FeRAM memory cells which are selectable and operable to store binary data, and wherein a target memory cell of the plurality of FeRAM memory cells is selected and accessed during memory operations for the storage and retrieval of the binary data;

a segment decoder operable to select a target segment of the array associated with the target memory cell;

a bitline decoder operable to select the pair of bitlines associated with the sense amplifier and the target memory cell;

a plate line decoder operable to select a target plate line associated with the target memory cell;

a word line decoder operable to select a target word line associated with the target memory cell; and the sense amplifier associated with the target memory cell and the selected pair of bitlines, operable to determine the logic state of the target memory cell during a memory read operation;

wherein the sense amplifier, segment decoder, bitline decoder, plate line decoder, and word line decoder cooperate to selectively couple and transfer binary data between the target memory cell and the data buffer, wherein the data buffer is operable to selectively couple to the target segment, thereby being shared between the segments of the array of memory cells.

2. The segment decoder of claim 1, comprising:

a plurality of segment address inputs operable to receive segment address data of the array of FeRAM memory cells associated with the target memory cell;

a plurality of segment output circuits, operable to couple a target word line common node of the target segment to a corresponding main word line of the selected array of FeRAM memory cells, and operable to couple a target plate line common node of the target segment to a corresponding main plate line of the array of FeRAM memory cells; and a segment address circuit operable to receive the segment address data, decode the target word line and target plate line segments of the array associated with the target memory cell, and select the corresponding outputs of the plurality of segment output circuits, whereby the target word line and target plate line of the target segment are coupleable to the corresponding main word line and main plate line of the array, for the transfer of word line and plate line data during memory operations.

3. The plurality of segment output circuits of claim 2, each comprising a plurality of individually addressable MOS transistors operable to couple the target word line and target plate line of the target segment to the corresponding main word line and main plate line of the array, for the transfer of word line and plate line data during memory operations.

4. The memory cells of claim 1, comprising FeRAM memory cells which are operable to store binary data in a ferro-electric capacitor.

5. The memory cells of claim 1, comprising one of a 1T1C and a 1C FeRAM memory configuration.

6. The ferro-electric memory device of claim 1, wherein the data buffer is further operable to be shared with a plurality of sense amplifiers, array segments, bit line segments, word line segments, plate line segments, memory cells of the array, and a plurality of arrays.

7. The ferro-electric memory device of claim 1, wherein the array of FeRAM memory cells is arranged in an open bitline architecture.

8. The ferro-electric memory device of claim 1, further comprising:

the data buffer being associated with a pair of I/O lines and a pair of main I/O lines, wherein the data buffer is operable to store temporary data for a memory operation;

a pair of I/O switch transistors operable to couple the data buffer to the pair of bitlines and the sense amplifier which is associated with the target memory cell via the I/O lines for transfer of memory data; and a pair of main I/O switch transistors operable to couple the data buffer to an external memory device via the main I/O lines for transfer of memory data.

9. The ferro-electric memory device of claim 1, wherein the array of FeRAM memory cells is further divided into bit line direction segments, whereby the sense amplifier associated with a given pair of bit lines is shared with multiple array segments in the bit line direction.

10. The memory device of claim 1, wherein the FeRAM memory cell further comprises:

a ferro-electric capacitor;

a memory cell access transistor, operable to access and couple voltages for memory operations between the ferro-electric capacitor and a bitline of the pair of bitlines associated with an FeRAM memory cell to be read, also known as an FeRAM 1T1C cell.

11. A ferro-electric memory device, comprising:

an array of FeRAM memory cells associated with a plurality of plate lines and a data buffer, wherein the array is further subdivided in a word line direction into segments which are individually selectable, and wherein each segment of the array is associated with the plurality of plate lines, a pair of bitlines and a sense amplifier, and wherein each segment comprises a plurality of FeRAM memory cells which are selectable and operable to store binary data, and wherein a target memory cell of the plurality of FeRAM memory cells is selected and accessed during memory operations for the storage and retrieval of the binary data;

a segment decoder operable to select a target segment of the array associated with the target memory cell;

a bitline decoder operable to select the pair of bitlines associated with the sense amplifier and the target memory cell;

a plate line decoder operable to select a target plate line associated with the target memory cell; and the sense amplifier associated with the target memory cell and the selected pair of bitlines, operable to determine the logic state of the target memory cell during a memory read operation;

wherein the sense amplifier, segment decoder, bitline decoder, and plate line decoder cooperate to selectively couple and transfer binary data between the target memory cell and the data buffer, wherein the data buffer is shared between the segments of the array of memory cells.

12. The segment decoder of claim 11, comprising:

a plurality of segment address inputs operable to receive segment address data of the array of FeRAM memory cells associated with the target memory cell;

a plurality of segment output circuits, operable to couple a target plate line common node of the target segment to a corresponding main plate line of the array of FeRAM memory cells; and a segment address circuit operable to receive the segment address data, decode the target plate line segments of the array associated with the target memory cell, and select the corresponding outputs of the plurality of segment output circuits, whereby the target plate line of the target segment are coupleable to the corresponding main plate line of the array, for the transfer of plate line data during memory operations.

13. The plurality of segment output circuits of claim 12, each comprising a plurality of individually addressable MOS transistors operable to couple the target plate line of the target segment to the corresponding main plate line of the array, for the transfer of plate line data during memory operations.

14. The memory cells of claim 11, comprising FeRAM memory cells which are operable to store binary data in a ferro-electric capacitor.

15. The memory cells of claim 11, comprising one of a 1T1C and a 1C FeRAM memory configuration.

16. The ferro-electric memory device of claim 11, wherein the data buffer is further operable to be shared with a plurality of sense amplifiers, array segments, bit line segments, word line segments, plate line segments, memory cells of the array, and a plurality of arrays.

17. The ferro-electric memory device of claim 11, wherein the array of FeRAM memory cells is arranged in an open bitline architecture.

18. The ferro-electric memory device of claim 11, further comprising:

the data buffer being associated with a pair of I/O lines and a pair of main I/O lines, wherein the data buffer is operable to store temporary data for a memory operation;

a pair of I/O switch transistors operable to couple the data buffer to the pair of bitlines and the sense amplifier which is associated with the target memory cell via the I/O lines for transfer of memory data; and a pair of main I/O switch transistors operable to couple the data buffer to an external memory device via the main I/O lines for transfer of memory data.

19. The ferro-electric memory device of claim 11, whereby the sense amplifier associated with a given pair of bit lines is shared with multiple array segments in the bit line direction.

20. The memory device of claim 11, wherein the FeRAM memory cell further comprises a ferro-electric capacitor associated with a bitline, also known as an FeRAM 1C cell.

* * * * *